(12) United States Patent
Tzoufras et al.

(10) Patent No.: US 10,600,478 B2
(45) Date of Patent: *Mar. 24, 2020

(54) MULTI-BIT CELL READ-OUT TECHNIQUES FOR MRAM CELLS WITH MIXED PINNED MAGNETIZATION ORIENTATIONS

(71) Applicant: SPIN MEMORY, INC., Fremont, CA (US)

(72) Inventors: Michail Tzoufras, Sunnyvale, CA (US); Marcin Gajek, Berkeley, CA (US); Kadriye Deniz Bozdag, Sunnyvale, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/122,745

(22) Filed: Sep. 5, 2018

(65) Prior Publication Data

US 2020/0013455 A1 Jan. 9, 2020

Related U.S. Application Data

(63) Continuation-in-part of application No. 16/028,412, filed on Jul. 6, 2018, and a continuation-in-part of application No. 16/028,415, filed on Jul. 6, 2018.

(51) Int. Cl.
*G11C 11/56* (2006.01)
*G11C 11/16* (2006.01)
(Continued)

(52) U.S. Cl.
CPC ........ *G11C 11/5607* (2013.01); *G11C 11/161* (2013.01); *G11C 11/1655* (2013.01);
(Continued)

(58) Field of Classification Search
CPC .............. G11C 11/1673; G11C 11/161; G11C 11/1655; G11C 11/1675; H01L 27/222; H01L 43/08
(Continued)

(56) References Cited

U.S. PATENT DOCUMENTS 4,597,487 A 7/1986 Crosby et al.
5,541,868 A 7/1996 Prinz
(Continued)

FOREIGN PATENT DOCUMENTS

CA 2766141 1/2011
CN 105706259 6/2016
(Continued)

OTHER PUBLICATIONS

US 7,026,672 B2, 04/2006, Grandis (withdrawn)
(Continued)

*Primary Examiner* — Fernando Hidalgo

(57) ABSTRACT

Techniques for reading a Multi-Bit Cell (MBC) can include sensing a state parameter value, such as source line voltage, and applying a successive one of N programming parameter values, such as successive programming currents, between instances of sensing the state parameter values. The N successive programming parameter values can be selected to switch the state of a corresponding one of N cell elements of the MBC. Successive ones of the sensed state parameter values can be compared to determine N state change results, which can be used to determine the read state of the MBC.

30 Claims, 24 Drawing Sheets

(51) Int. Cl.
*H01L 43/02* (2006.01)
*H01L 43/10* (2006.01)
*H01L 27/22* (2006.01)

(52) U.S. Cl.
CPC ...... *G11C 11/1657* (2013.01); *G11C 11/1673* (2013.01); *G11C 11/1675* (2013.01); *H01L 43/02* (2013.01); *G11C 11/1659* (2013.01); *H01L 27/228* (2013.01); *H01L 43/10* (2013.01)

(58) Field of Classification Search
USPC ........................................................ 365/158
See application file for complete search history.

(56) References Cited

U.S. PATENT DOCUMENTS

| | | | |
|---|---|---|---|
| 5,559,952 A | 9/1996 | Fujimoto | |
| 5,629,549 A | 5/1997 | Johnson | |
| 5,640,343 A | 6/1997 | Gallagher et al. | |
| 5,654,566 A | 8/1997 | Johnson | |
| 5,691,936 A | 11/1997 | Sakakima et al. | |
| 5,695,846 A | 12/1997 | Lange et al. | |
| 5,695,864 A | 12/1997 | Zlonczewski | |
| 5,732,016 A | 3/1998 | Chen et al. | |
| 5,751,647 A | 5/1998 | O'Toole | |
| 5,856,397 A | 1/1999 | Mauri | |
| 5,856,897 A | 1/1999 | Mauri | |
| 5,896,252 A | 4/1999 | Kanai | |
| 5,966,323 A | 10/1999 | Chen et al. | |
| 6,016,269 A | 1/2000 | Peterson et al. | |
| 6,055,179 A | 4/2000 | Koganei et al. | |
| 6,064,948 A | 5/2000 | West | |
| 6,075,941 A | 6/2000 | Itoh | |
| 6,097,579 A | 8/2000 | Gill | |
| 6,112,295 A | 8/2000 | Bhamidipati et al. | |
| 6,124,711 A | 9/2000 | Tanaka et al. | |
| 6,134,138 A | 10/2000 | Lu et al. | |
| 6,140,838 A | 10/2000 | Johnson | |
| 6,154,139 A | 11/2000 | Kanai et al. | |
| 6,154,349 A | 11/2000 | Kanai et al. | |
| 6,172,902 B1 | 1/2001 | Wegrowe et al. | |
| 6,233,172 B1 | 5/2001 | Chen et al. | |
| 6,233,690 B1 | 5/2001 | Choi et al. | |
| 6,243,288 B1 | 6/2001 | Ishikawa et al. | |
| 6,252,798 B1 | 6/2001 | Satoh et al. | |
| 6,256,223 B1 | 7/2001 | Sun | |
| 6,292,389 B1 | 9/2001 | Chen et al. | |
| 6,347,049 B1 | 2/2002 | Childress et al. | |
| 6,376,260 B1 | 4/2002 | Chen et al. | |
| 6,385,082 B1 | 5/2002 | Abraham et al. | |
| 6,436,526 B1 | 8/2002 | Odagawa et al. | |
| 6,442,681 B1 | 8/2002 | Ryan et al. | |
| 6,447,935 B1 | 9/2002 | Zhang et al. | |
| 6,458,603 B1 | 10/2002 | Kersch et al. | |
| 6,493,197 B2 | 12/2002 | Ito et al. | |
| 6,522,137 B1 | 2/2003 | Sun et al. | |
| 6,532,164 B2 | 3/2003 | Redon et al. | |
| 6,538,918 B2 | 3/2003 | Swanson et al. | |
| 6,545,903 B1 | 4/2003 | Savtchenko et al. | |
| 6,545,906 B1 | 4/2003 | Savtchenko et al. | |
| 6,563,681 B1 | 5/2003 | Sasaki et al. | |
| 6,566,246 B1 | 5/2003 | deFelipe et al. | |
| 6,603,677 B2 | 8/2003 | Redon et al. | |
| 6,608,776 B2 | 8/2003 | Hidaka | |
| 6,635,367 B2 | 10/2003 | Igarashi et al. | |
| 6,653,153 B2 | 11/2003 | Doan et al. | |
| 6,654,278 B1 | 11/2003 | Engel et al. | |
| 6,677,165 B1 | 1/2004 | Lu et al. | |
| 6,710,984 B1 | 3/2004 | Yuasa et al. | |
| 6,713,195 B2 | 3/2004 | Wang et al. | |
| 6,714,444 B2 | 3/2004 | Huai et al. | |
| 6,731,537 B2 | 5/2004 | Kanamori | |
| 6,744,086 B2 | 6/2004 | Daughton et al. | |
| 6,750,491 B2 | 6/2004 | Sharma et al. | |
| 6,751,074 B2 | 6/2004 | Inomata et al. | |
| 6,765,824 B2 | 7/2004 | Kishi et al. | |
| 6,772,036 B2 | 8/2004 | Eryurek et al. | |
| 6,773,515 B2 | 8/2004 | Li et al. | |
| 6,777,730 B2 | 8/2004 | Daughton et al. | |
| 6,785,159 B2 | 8/2004 | Tuttle | |
| 6,807,091 B2 | 10/2004 | Saito | |
| 6,812,437 B2 | 11/2004 | Levy | |
| 6,829,161 B2 | 12/2004 | Huai et al. | |
| 6,835,423 B2 | 12/2004 | Chen et al. | |
| 6,838,740 B2 | 1/2005 | Huai et al. | |
| 6,839,821 B2 | 1/2005 | Estakhri | |
| 6,842,317 B2 | 1/2005 | Sugita et al. | |
| 6,842,366 B2 | 1/2005 | Chan | |
| 6,847,547 B2 | 1/2005 | Albert et al. | |
| 6,879,512 B2 | 4/2005 | Luo | |
| 6,887,719 B2 | 5/2005 | Lu et al. | |
| 6,888,742 B1 | 5/2005 | Nguyen et al. | |
| 6,902,807 B1 | 6/2005 | Argitia et al. | |
| 6,906,369 B2 | 6/2005 | Ross et al. | |
| 6,920,063 B2 | 7/2005 | Huai et al. | |
| 6,933,155 B2 | 8/2005 | Albert et al. | |
| 6,936,479 B2 | 8/2005 | Sharma | |
| 6,938,142 B2 | 8/2005 | Pawlowski | |
| 6,956,257 B2 | 10/2005 | Zhu et al. | |
| 6,958,507 B2 | 10/2005 | Atwood et al. | |
| 6,958,927 B1 | 10/2005 | Nguyen et al. | |
| 6,967,863 B2 | 11/2005 | Huai | |
| 6,980,469 B2 | 12/2005 | Kent et al. | |
| 6,984,529 B2 | 1/2006 | Stojakovic et al. | |
| 6,985,385 B2 | 1/2006 | Nguyen et al. | |
| 6,992,359 B2 | 1/2006 | Nguyen et al. | |
| 6,995,962 B2 | 2/2006 | Saito et al. | |
| 7,002,339 B2 | 2/2006 | Kawabata et al. | |
| 7,002,839 B2 | 2/2006 | Kawabata et al. | |
| 7,005,958 B2 | 2/2006 | Wan | |
| 7,006,371 B2 | 2/2006 | Matsuoka | |
| 7,006,375 B2 | 2/2006 | Covington | |
| 7,009,877 B1 | 3/2006 | Huai et al. | |
| 7,033,126 B2 | 4/2006 | Van Den Berg | |
| 7,041,598 B2 | 5/2006 | Sharma | |
| 7,045,368 B2 | 5/2006 | Hong et al. | |
| 7,054,119 B2 | 5/2006 | Sharma et al. | |
| 7,057,922 B2 | 6/2006 | Fukumoto | |
| 7,095,646 B2 | 8/2006 | Slaughter et al. | |
| 7,098,494 B2 | 8/2006 | Pakala et al. | |
| 7,106,624 B2 | 9/2006 | Huai et al. | |
| 7,110,287 B2 | 9/2006 | Huai et al. | |
| 7,149,106 B2 | 12/2006 | Mancoff et al. | |
| 7,161,329 B2 | 1/2007 | Huai et al. | |
| 7,166,881 B2 | 1/2007 | Lin | |
| 7,170,778 B2 | 1/2007 | Kent et al. | |
| 7,187,577 B1 | 3/2007 | Wang | |
| 7,190,611 B2 | 3/2007 | Nguyen et al. | |
| 7,203,129 B2 | 4/2007 | Lin et al. | |
| 7,203,802 B2 | 4/2007 | Huras | |
| 7,227,773 B1 | 6/2007 | Nguyen et al. | |
| 7,233,039 B2 | 6/2007 | Huai et al. | |
| 7,242,045 B2 | 7/2007 | Nguyen et al. | |
| 7,245,462 B2 | 7/2007 | Huai et al. | |
| 7,262,941 B2 | 8/2007 | Li et al. | |
| 7,273,780 B2 | 9/2007 | Kim | |
| 7,283,333 B2 | 10/2007 | Gill | |
| 7,307,876 B2 | 12/2007 | Kent et al. | |
| 7,313,015 B2 | 12/2007 | Bessho | |
| 7,324,387 B1 | 1/2008 | Bergemont et al. | |
| 7,324,389 B2 | 1/2008 | Cernea | |
| 7,335,960 B2 | 2/2008 | Han et al. | |
| 7,351,594 B2 | 4/2008 | Bae et al. | |
| 7,352,021 B2 | 4/2008 | Bae et al. | |
| 7,369,427 B2 | 5/2008 | Diao et al. | |
| 7,372,722 B2 | 5/2008 | Jeong | |
| 7,376,006 B2 | 5/2008 | Bednorz et al. | |
| 7,386,765 B2 | 6/2008 | Ellis | |
| 7,404,017 B2 | 7/2008 | Kuo | |
| 7,421,535 B2 | 9/2008 | Jarvis et al. | |
| 7,436,699 B2 | 10/2008 | Tanizaki | |
| 7,449,345 B2 | 11/2008 | Horng et al. | |
| 7,453,719 B2 | 11/2008 | Sakimura | |

(56) References Cited

U.S. PATENT DOCUMENTS

| | | |
|---|---|---|
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |
| 7,663,171 B2 | 2/2010 | Inokuchi et al. |
| 7,675,792 B2 | 3/2010 | Bedeschi |
| 7,696,551 B2 | 4/2010 | Xiao |
| 7,733,699 B2 | 6/2010 | Roohparvar |
| 7,739,559 B2 | 6/2010 | Suzuki et al. |
| 7,773,439 B2 | 8/2010 | Do et al. |
| 7,776,665 B2 | 8/2010 | Izumi et al. |
| 7,796,439 B2 | 9/2010 | Arai |
| 7,810,017 B2 | 10/2010 | Radke |
| 7,821,818 B2 | 10/2010 | Dieny et al. |
| 7,852,662 B2 | 12/2010 | Yang |
| 7,861,141 B2 | 12/2010 | Chen |
| 7,881,095 B2 | 2/2011 | Lu |
| 7,911,832 B2 | 3/2011 | Kent et al. |
| 7,916,515 B2 | 3/2011 | Li |
| 7,936,595 B2 | 5/2011 | Han et al. |
| 7,936,598 B2 | 5/2011 | Zheng et al. |
| 7,983,077 B2 | 7/2011 | Park |
| 7,986,544 B2 | 7/2011 | Kent et al. |
| 8,008,095 B2 | 8/2011 | Assefa et al. |
| 8,028,119 B2 | 9/2011 | Miura |
| 8,041,879 B2 | 10/2011 | Erez |
| 8,055,957 B2 | 11/2011 | Kondo |
| 8,058,925 B2 | 11/2011 | Rasmussen |
| 8,059,460 B2 | 11/2011 | Jeong et al. |
| 8,072,821 B2 | 12/2011 | Arai |
| 8,077,496 B2 | 12/2011 | Choi |
| 8,080,365 B2 | 12/2011 | Nozaki |
| 8,088,556 B2 | 1/2012 | Nozaki |
| 8,094,480 B2 | 1/2012 | Tonomura |
| 8,102,701 B2 | 1/2012 | Prejbeanu et al. |
| 8,105,948 B2 | 1/2012 | Zhong et al. |
| 8,120,949 B2 | 2/2012 | Ranjan et al. |
| 8,143,683 B2 | 3/2012 | Wang et al. |
| 8,144,509 B2 | 3/2012 | Jung |
| 8,148,970 B2 | 4/2012 | Fuse |
| 8,159,867 B2 | 4/2012 | Cho et al. |
| 8,201,024 B2 | 6/2012 | Burger |
| 8,223,534 B2 | 7/2012 | Chung |
| 8,255,742 B2 | 8/2012 | Ipek |
| 8,278,996 B2 | 10/2012 | Mild |
| 8,279,666 B2 | 10/2012 | Dieny et al. |
| 8,295,073 B2 | 10/2012 | Norman |
| 8,295,082 B2 | 10/2012 | Chua-Eoan |
| 8,334,213 B2 | 12/2012 | Mao |
| 8,345,474 B2 | 1/2013 | Oh |
| 8,349,536 B2 | 1/2013 | Nozak |
| 8,362,580 B2 | 1/2013 | Chen et al. |
| 8,363,465 B2 | 1/2013 | Kent et al. |
| 8,374,050 B2 | 2/2013 | Zhou et al. |
| 8,386,836 B2 | 2/2013 | Burger |
| 8,415,650 B2 | 4/2013 | Greene |
| 8,416,620 B2 | 4/2013 | Zheng et al. |
| 8,422,286 B2 | 4/2013 | Ranjan et al. |
| 8,422,330 B2 | 4/2013 | Hatano et al. |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong et al. |
| 8,477,530 B2 | 7/2013 | Ranjan et al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,542,524 B2 | 9/2013 | Keshtbod et al. |
| 8,549,303 B2 | 10/2013 | Fifield et al. |
| 8,558,334 B2 | 10/2013 | Ueki et al. |
| 8,559,215 B2 | 10/2013 | Zhou et al. |
| 8,574,928 B2 | 11/2013 | Satoh et al. |
| 8,582,353 B2 | 11/2013 | Lee |
| 8,590,139 B2 | 11/2013 | Op DeBeeck et al. |
| 8,592,927 B2 | 11/2013 | Jan |
| 8,593,868 B2 | 11/2013 | Park |
| 8,609,439 B2 | 12/2013 | Prejbeanu et al. |
| 8,617,408 B2 | 12/2013 | Balamane |
| 8,625,339 B2 | 1/2014 | Ong |
| 8,634,232 B2 | 1/2014 | Oh |
| 8,667,331 B2 | 3/2014 | Hari |
| 8,687,415 B2 | 4/2014 | Parkin et al. |
| 8,705,279 B2 | 4/2014 | Kim |
| 8,716,817 B2 | 5/2014 | Saida |
| 8,716,818 B2 | 5/2014 | Yoshikawa et al. |
| 8,722,543 B2 | 5/2014 | Belen |
| 8,724,380 B1 | 5/2014 | Zhou |
| 8,737,137 B1 | 5/2014 | Choy et al. |
| 8,755,222 B2 | 6/2014 | Kent et al. |
| 8,779,410 B2 | 7/2014 | Sato et al. |
| 8,780,617 B2 | 7/2014 | Kang |
| 8,792,269 B1 | 7/2014 | Abedifard |
| 8,802,451 B2 | 8/2014 | Malmhall |
| 8,810,974 B2 | 8/2014 | Noel et al. |
| 8,817,525 B2 | 8/2014 | Ishihara |
| 8,832,530 B2 | 9/2014 | Pangal et al. |
| 8,852,760 B2 | 10/2014 | Wang et al. |
| 8,853,807 B2 | 10/2014 | Son et al. |
| 8,860,156 B2 | 10/2014 | Beach et al. |
| 8,862,808 B2 | 10/2014 | Tsukamoto et al. |
| 8,867,258 B2 | 10/2014 | Rao |
| 8,883,520 B2 | 11/2014 | Satoh et al. |
| 8,902,628 B2 | 12/2014 | Ha |
| 8,966,345 B2 | 2/2015 | Wilkerson |
| 8,987,849 B2 | 3/2015 | Jan |
| 9,019,754 B1 | 4/2015 | Bedeschi |
| 9,025,378 B2 | 5/2015 | Tokiwa |
| 9,026,888 B2 | 5/2015 | Kwok |
| 9,030,899 B2 | 5/2015 | Lee |
| 9,036,407 B2 | 5/2015 | Wang et al. |
| 9,037,812 B2 | 5/2015 | Chew |
| 9,043,674 B2 | 5/2015 | Wu |
| 9,070,441 B2 | 6/2015 | Otsuka et al. |
| 9,070,855 B2 | 6/2015 | Gan et al. |
| 9,076,530 B2 | 7/2015 | Gomez et al. |
| 9,082,888 B2 | 7/2015 | Kent et al. |
| 9,104,581 B2 | 8/2015 | Fee et al. |
| 9,104,595 B2 | 8/2015 | Sah |
| 9,130,155 B2 | 9/2015 | Chepulskyy et al. |
| 9,136,463 B2 | 9/2015 | Li |
| 9,140,747 B2 | 9/2015 | Kim |
| 9,165,629 B2 | 10/2015 | Chih |
| 9,165,787 B2 | 10/2015 | Kang |
| 9,166,155 B2 | 10/2015 | Deshpande |
| 9,178,958 B2 | 11/2015 | Lindamood |
| 9,189,326 B2 | 11/2015 | Kalamatianos |
| 9,190,471 B2 | 11/2015 | Yi et al. |
| 9,196,332 B2 | 11/2015 | Zhang et al. |
| 9,229,306 B2 | 1/2016 | Mekhanik |
| 9,229,853 B2 | 1/2016 | Khan |
| 9,231,191 B2 | 1/2016 | Huang et al. |
| 9,245,608 B2 | 1/2016 | Chen et al. |
| 9,250,990 B2 | 2/2016 | Motwani |
| 9,250,997 B2 | 2/2016 | Kim et al. |
| 9,251,896 B2 | 2/2016 | Ikeda |
| 9,257,483 B2 | 2/2016 | Ishigaki |
| 9,263,667 B1 | 2/2016 | Pinarbasi |
| 9,286,186 B2 | 3/2016 | Weiss |

(56) References Cited

U.S. PATENT DOCUMENTS

| | | |
|---|---|---|
| 9,298,552 B2 | 3/2016 | Leem |
| 9,299,412 B2 | 3/2016 | Naeimi |
| 9,317,429 B2 | 4/2016 | Ramanujan |
| 9,324,457 B2 | 4/2016 | Takizawa |
| 9,337,412 B2 | 5/2016 | Pinarbasi et al. |
| 9,341,939 B1 | 5/2016 | Yu et al. |
| 9,342,403 B2 | 5/2016 | Keppel et al. |
| 9,349,482 B2 | 5/2016 | Kim et al. |
| 9,351,399 B2 | 5/2016 | Bose et al. |
| 9,362,486 B2 | 6/2016 | Kim et al. |
| 9,378,817 B2 | 6/2016 | Kawai |
| 9,379,314 B2 | 6/2016 | Park et al. |
| 9,389,954 B2 | 7/2016 | Pelley et al. |
| 9,396,065 B2 | 7/2016 | Webb et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,431,084 B2 | 8/2016 | Bose et al. |
| 9,449,720 B1 | 9/2016 | Lung |
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |
| 9,548,116 B2 | 1/2017 | Roy |
| 9,548,445 B2 | 1/2017 | Lee et al. |
| 9,553,102 B2 | 1/2017 | Wang |
| 9,583,167 B2 | 2/2017 | Chung |
| 9,594,683 B2 | 3/2017 | Dittrich |
| 9,600,183 B2 | 3/2017 | Tomishima et al. |
| 9,608,038 B2 | 3/2017 | Wang et al. |
| 9,634,237 B2 | 4/2017 | Lee et al. |
| 9,640,267 B2 | 5/2017 | Tani |
| 9,646,701 B2 | 5/2017 | Lee |
| 9,652,321 B2 | 5/2017 | Motwani |
| 9,662,925 B2 | 5/2017 | Raksha et al. |
| 9,697,140 B2 | 7/2017 | Kwok |
| 9,720,616 B2 | 8/2017 | Yu |
| 9,728,240 B2 | 8/2017 | Abedifard |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,858,976 B2 | 1/2018 | Ikegami |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 10,347,308 B1 | 7/2019 | Bozdag |
| 10,403,343 B2 | 9/2019 | Bozdag |
| 2002/0090533 A1 | 7/2002 | Zhang et al. |
| 2002/0105823 A1 | 8/2002 | Redon et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0151614 A1 | 6/2008 | Guo |
| 2008/0259508 A2 | 10/2008 | Kent et al. |
| 2008/0278994 A1 | 11/2008 | Katti |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0124091 A1 | 5/2010 | Cowburn |
| 2010/0162065 A1 | 6/2010 | Norman |
| 2010/0193891 A1 | 8/2010 | Wang et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |
| 2012/0069649 A1 | 3/2012 | Ranjan et al. |
| 2012/0134200 A1 | 5/2012 | Khoueir |
| 2012/0155156 A1 | 6/2012 | Watts |
| 2012/0155158 A1 | 6/2012 | Higo |
| 2012/0155164 A1 | 6/2012 | Shukh |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0280339 A1 | 11/2012 | Zhang et al. |
| 2012/0292724 A1 | 11/2012 | Lim |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0244344 A1 | 9/2013 | Malmhall et al. |
| 2013/0258763 A1 | 10/2013 | Ranjan |
| 2013/0267042 A1 | 10/2013 | Satoh et al. |
| 2013/0270661 A1 | 10/2013 | Yi et al. |

(56) References Cited

U.S. PATENT DOCUMENTS

| | | |
|---|---|---|
| 2013/0272059 A1 | 10/2013 | Lin |
| 2013/0307097 A1 | 11/2013 | Yi et al. |
| 2013/0329488 A1 | 12/2013 | Abedlfard |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2015/0056368 A1 | 2/2015 | Wang et al. |
| 2015/0131370 A1 | 5/2015 | Zhou |
| 2015/0279904 A1 | 10/2015 | Pinarbasi et al. |
| 2016/0087193 A1 | 3/2016 | Pinarbasi et al. |
| 2016/0163973 A1 | 6/2016 | Pinarbasi |
| 2016/0218278 A1 | 7/2016 | Pinarbasi et al. |
| 2016/0283385 A1 | 9/2016 | Boyd et al. |
| 2016/0315118 A1 | 10/2016 | Kardasz et al. |
| 2016/0378592 A1 | 12/2016 | Ikegami et al. |
| 2017/0062712 A1 | 3/2017 | Choi et al. |
| 2017/0076771 A1* | 3/2017 | Stainer ............... G11C 11/5607 |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2018/0033957 A1 | 2/2018 | Zhang |
| 2018/0097006 A1 | 4/2018 | Kim et al. |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, issue 1, 2013, pp. 54-75 (22 pages).

S. Ikeda, et at, "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No, 23, Jun. 5, 2000, pp, 5419-5422 (4 pages).

K.J. Lee, et al., "Analytical Investigation of Spin-Transfer Dynamics Using Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2005, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

* cited by examiner

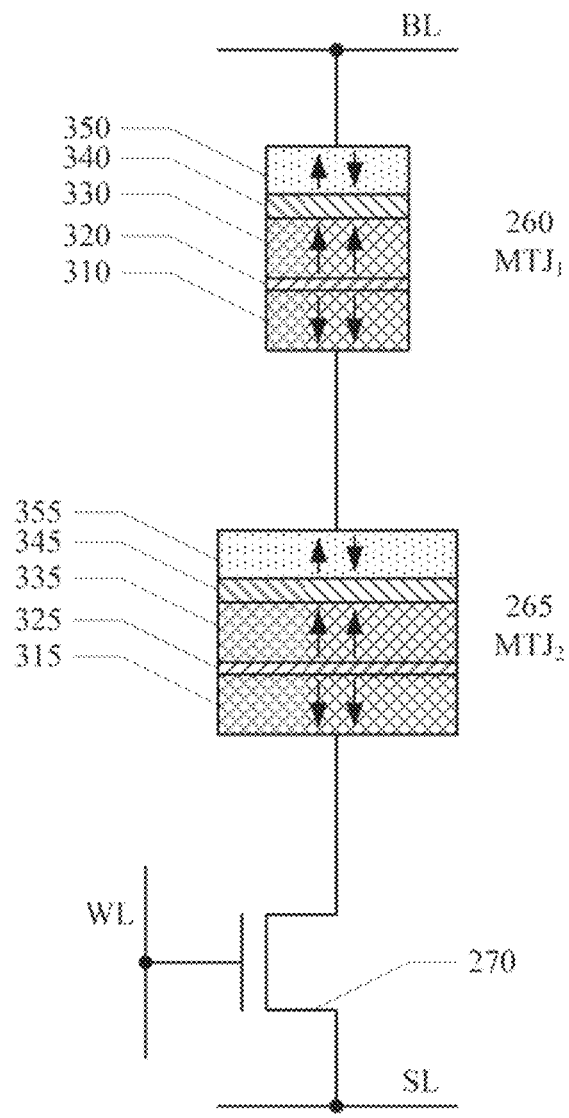
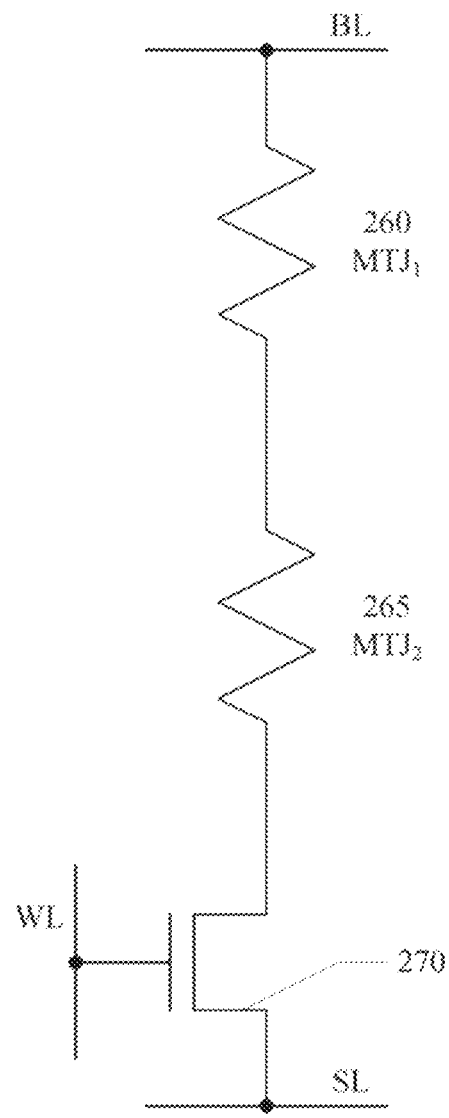
FIG. 3A
FIG. 3B

MULTI-BIT CELL READ-OUT TECHNIQUES FOR MRAM CELLS WITH MIXED PINNED MAGNETIZATION ORIENTATIONS

CROSS-REFERENCE TO RELATED APPLICATIONS

This is a Continuation-in-Part of U.S. patent application Ser. No. 16/028,412 filed Jul. 6, 2018 and U.S. patent application Ser. No. 16/028,415 filed Jul. 6, 2018, both of which are incorporated herein in their entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers of a Magnetic Tunnel Junction (MTJ). The MTJ can include two magnetic layers and a magnetic tunnel barrier layer. One of the magnetic layers can have a fixed magnetic polarization, while the polarization of the other magnetic layer can switch between opposite directions. Typically, if the magnetic layers have the same magnetic polarization the MTJ cell will exhibit a relatively low resistance value corresponding to a '0' bit state; while if the magnetic polarization between the two magnetic layers is antiparallel the MTJ cell will exhibit a relatively high resistance value corresponding to a '1' bit state. Because the data is stored in the magnetization state, MRAM devices are non-volatile memory devices. The state of a MRAM cell can be read by applying a predetermined current through the cell and measuring the resulting voltage, or by applying a predetermined voltage across the cell and measuring the resulting current. The sensed voltage is proportional to the resistance of the cell, the sensed current is inversely proportional to the resistance of the cell, and either of these can be compared to a reference value to determine the state of the cell.

MRAM devices are characterized by densities similar to Dynamic Random-Access Memory (DRAM), power consumption similar to flash memory, and speed similar to Static Random-Access Memory (SRAM). Although MRAIVI devices exhibit favorable performance characteristics as compared to other memory technologies, one technique for increasing the storage capacity is to store more than a single bit of information in each MTJ cell. However, there is a continuing need for improved reading, writing and error correcting techniques for use with Multi-Bit Cells (MBCs) that can store two bits per cell, Triple-Bit Cells (TBCs) that can store three bits per cell, Quad-Bit Cells (QBCs) that can store four bits per cell, and other architectures that can store a plurality of bits of data per cell.

SUMMARY OF THE INVENTION

The present technology may best be understood by referring to the following description and accompanying drawings that are used to illustrate aspects of the present technology directed toward apparatuses and methods for reading Multi-Bit Cells (MBC). In the conventional art, the term "Multi-Bit Cell (MBC)" is used to refer to storage cells that can store two bits of data per cell, and at other times to generally refer to cells that can store two, three, four or more bits of data per cell. Therefore, for the sake of clarity, the term "Multi-Bit Cell (MBC)" as used herein refers to cells that can store two, three, four or more bits of data per cell, including Triple-Bit Cells (TBCs), and Quad-Bit Cells (QBCs).

In aspects, the unique order of transitions between the states of the MTJ cell elements of the MBCs, the orientation of the respective pinned magnetization polarization of the MTJ cell elements of the MBCs, and a corresponding set of programming parameters can be utilized in self-referencing techniques for reading the state of the MBCs.

In one embodiment, the MBCs can include a plurality of MTJ cells, wherein the orientation of the pinned magnetization polarization of the MTJ cells are the same. Sets of programming parameters can be applied to sequentially drive the MTJ cells to known states. The state of the MBCs can then be determined based upon the sequence of state changes in response to the sequence of applied programming parameters.

In another embodiment, the MBCs can include two MTJ cells, wherein the orientation of the pinned magnetization polarization of the MTJ cells are the same. Sets of programming parameters can be sequentially applied to flip the state of a given MTJ cell at least one time. The state of the MBCs can then be determined based upon the sequence of state changes in response to the sequence of applied programming parameters.

In another embodiment, the MBCs can include two MTJ cells, wherein the orientation of the pinned magnetization polarization of the MTJ cells are different. Sets of programming parameters can be applied to sequentially drive the MTJ cells to known states. The state of the MBCs can then be determined based upon the sequence of state changes in response to the sequence of applied programming parameters.

In yet another embodiment, the MBCs can include two MTJ cells, wherein the orientation of the fixed magnetic layer of the MTJ cells are different. Sets of programming parameters can be applied to flip a given MTJ cell at least one time. The state of the MBCs can then be determined based upon the sequence of state changes in response to the sequence of applied programming parameters.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIGS. 3A and 3B show a Multi-Bit Cell (MBC), in accordance with aspects of the present technology.

DETAILED DESCRIPTION OF THE INVENTION

Figure 1:
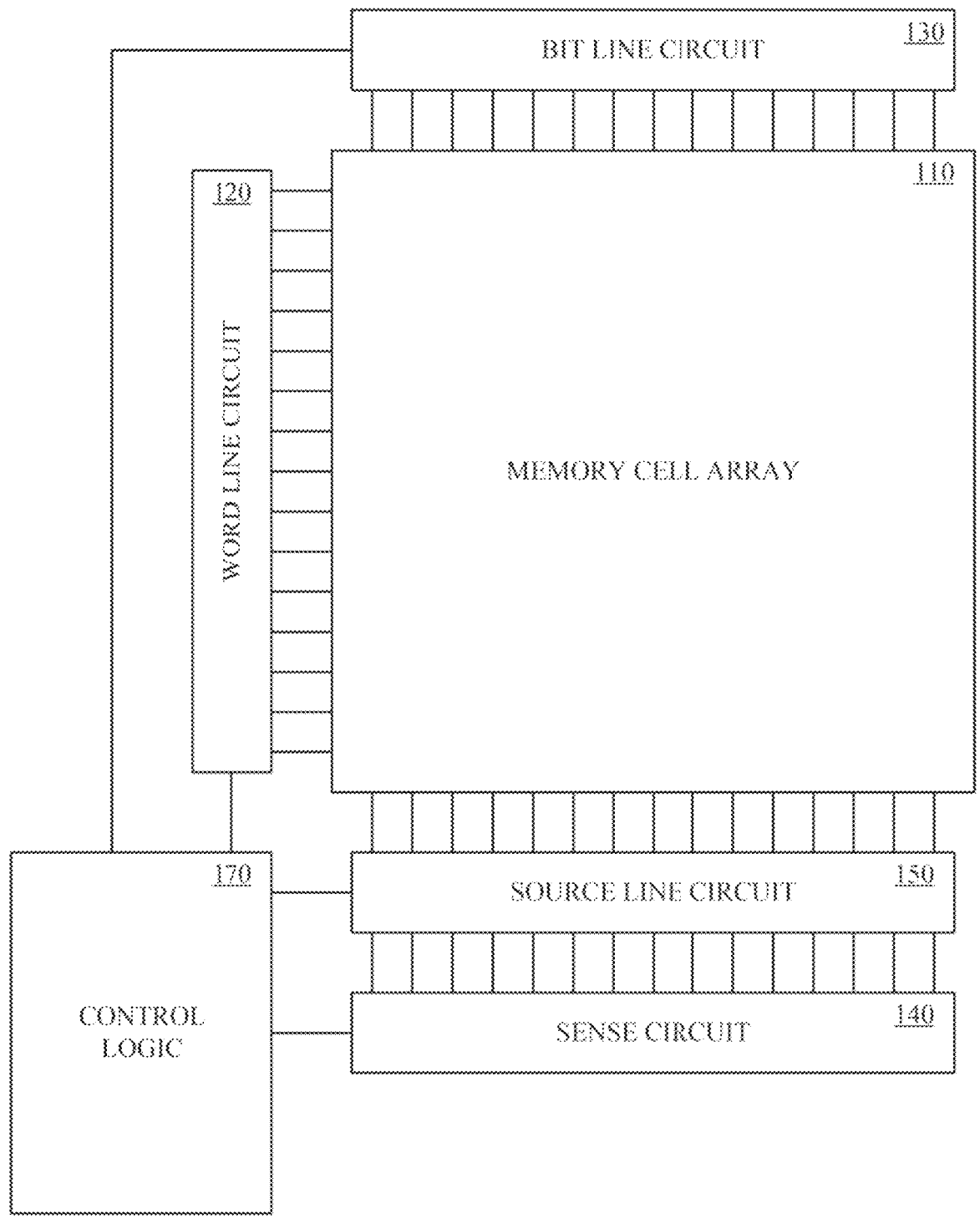
FIG. 1 shows a block diagram of a memory device, in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic or spintronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic or spintronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

In aspects, a memory cell array can be read by sequentially applying different successive sets of state programming conditions to a selected plurality of the MBCs. The MBCs can include a plurality of cell elements having different sets of state parameter values. A respective set of state programming conditions can program a corresponding one of the plurality of cell elements to a respective state parameter value. After applying each of the sets of programming conditions, a state change result can be determined for the selected plurality of the MBCs. A read state of the selected plurality of MBCs can be determined based the determined state change results. Accordingly, a destructive self-reference sensing technique can be used to read the selected plurality of MBCs. The self-reference technique can be used to reduce the effect of bit-to-bit process variations in the cell elements when reading the MBCs.

Referring to FIG. 1 a block diagram of a memory device, in accordance with aspects of the present technology, is shown. The memory device 100 can include a memory cell array 110 and one or more memory circuits 120-170. The MBCs can include a plurality of cell elements having different sets of state parameter values. The one or more memory circuits 120-170 can be configured for reading and writing to selected groups of MBCs in the memory cell array 110.

Figure 2:
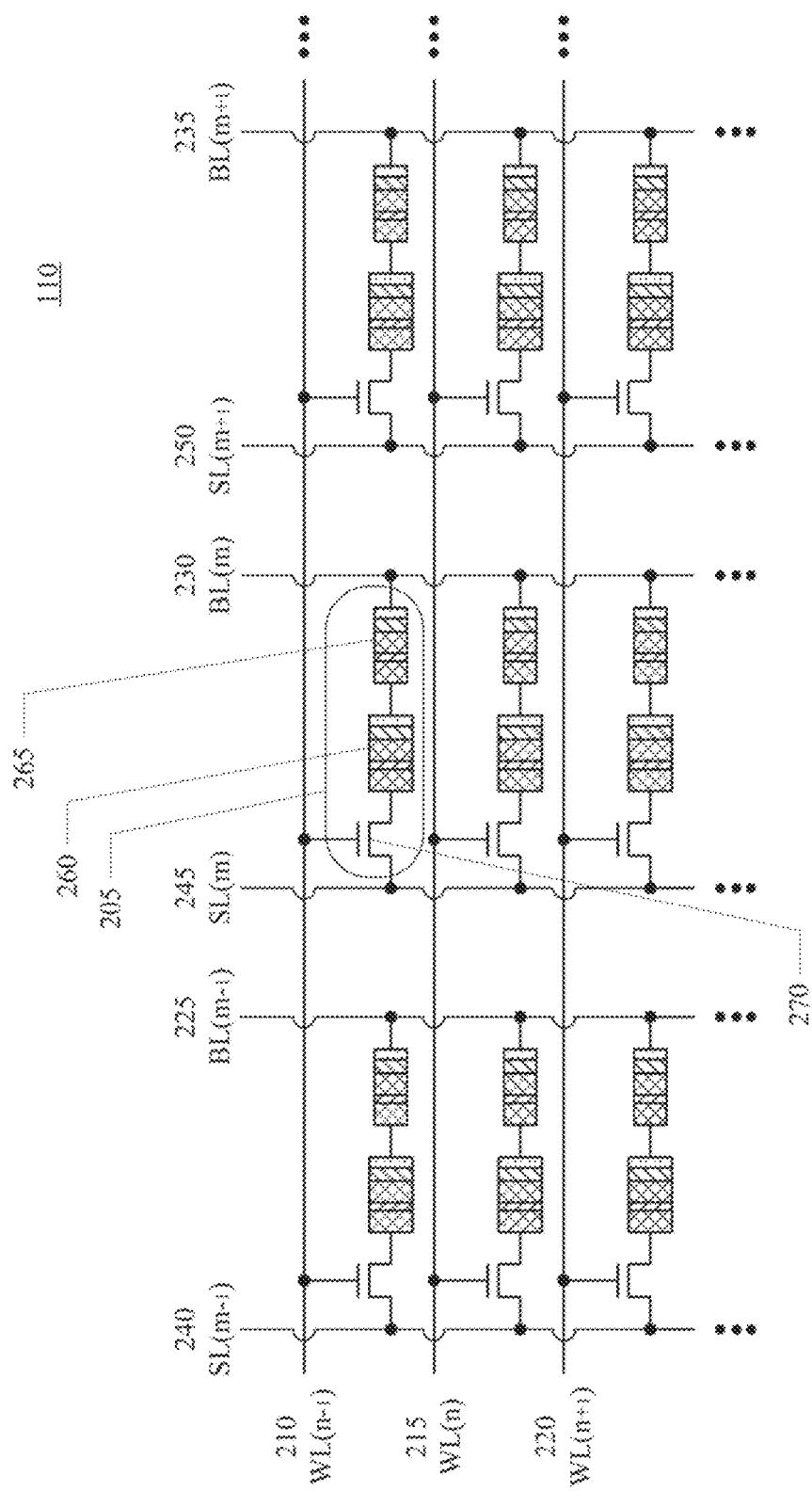
FIG. 2 shows a memory cell array, in accordance with aspects of the present technology.

Referring now to FIG. 2 a memory cell array, in accordance with aspects of the present technology, is shown. In aspects, the memory cell array can include an array of MBCs 205, a plurality of word lines 210-220, a plurality of bit lines 225-235, and a plurality of source lines 240-250. The word lines 210-220 of the memory cell array 200 can be organized along rows of the array. The bit lines 225-235 and source lines 240-250 can be organized along columns of the array. The MBCs 205 can include a plurality of cell elements 260, 265 and a selector element 270 coupled in series between respective word lines 210-220 and respective source lines 240-250. Control gates of the selector elements 270 can be coupled to respective word lines 210-220.

Referring now to FIGS. 3A and 3B, a MBC, in accordance with aspects of the present technology, is shown. The MBC 205 can include a plurality of cell elements 260, 265 and a selector element 270. FIG. 3A illustrates an exemplary structure of a MBC 205 including two Magnetic Tunnel Junction (MTJ) cell elements 260, 265. Each MTJ cell element can include a first fixed magnetic layer 310, 315 having a fixed magnetization polarization, a coupling layer 320, 325, and a second fixed magnetic layer 330, 335 having a fixed magnetization polarization that is coupled antiferromagnetically to the first magnetic layer 310, 315 through the coupling layer 320, 325. Each MTJ cell element 260, 265 can also include a magnetic tunnel barrier layer 320 and a free magnetic layer 325. The free magnetic layer in each MTJ can be selectively switchable between opposite magnetization polarizations.

In aspects, the magnetization polarization of the first fixed magnetic layer 310, 315 can be opposite the fixed magnetization polarization of the second fixed magnetic layer 330, 335 to prevent the magnetization polarization of the second fixed magnetic layer 330, 335 from flipping during writing or reading of the MTJ cell elements 260, 265, while also enabling the switching of the free magnetic layer 350, 355 at relatively low currents. The combined magnetization polarization of the first and second magnetic layers 310, 330, 315, 335 coupled through the coupling layer 320, 325 can be referred to as the pinned magnetization polarization of the MTJ cell elements 260, 265. Typically, the pinned magnetization polarization can correspond to the magnetization polarization of the second magnetic layer 330, 335 of the MTJ cell elements 260, 265. In aspects, the pinned magnetization polarization of the first MTJ cell element 260 can have the same orientation of the pinned magnetization polarization of the second MTJ cell element 265, as illustrated in FIG. 3A. For example, the pinned magnetization polarization orientation of the first and second MTJ cell elements 260, 265 may both be in first direction (e.g., up) corresponding to the magnetization polarization of the second magnetic layer 330, 335 of the MTJ cell elements 260, 265.

In another implementation, the MTJ cell elements 260, 265 can include a single fixed magnetic layer 330, 335. In such an implementation, the magnetization polarization (e.g., up) of the fixed magnetic layers 330, 335 of the first and second MTJ cell elements 260, 265 can both have the same orientation. In other implementations, the MTJ cell elements 260, 265 can include any number of fixed magnetic layers, with the corresponding pinned magnetization polarization of the first and second MTJ cell elements being in the same orientation.

In one implementation, the free magnetic layer 350, 355 can be a Cobalt-Iron-Boron (CoFeB) layer, the magnetic tunnel barrier layer 340, 345 can be a Magnesium-Oxide (MgO) layer, the second fixed magnetic layer 330, 335 can be a Cobalt-Iron-Boron (CoFeB) layer, the coupling layer 320, 325 can be a Ruthenium (Ru) layer, and the first fixed magnetic layer 310, 315 can be a Cobalt-Platinum (CoPt) or Cobalt-Nickel (CoNi). One or more additional layers can appear on either side of this structure.

Typically, if the second fixed magnetic layer 330, 335 and free magnetic layer 350, 355 have the same magnetic polarization (e.g., parallel), the MTJ cell element will exhibit a relatively low resistance value (Rp) corresponding to a '0' bit state; while if the magnetization polarization between the two magnetic layers 330, 335 and 350, 355 are antiparallel, the MTJ cell will exhibit a relatively high resistance value (Rap) corresponding to a '1' bit state.

FIG. 3B illustrates an exemplary resistive equivalence of the MTJ cell elements 260, 265. For MTJ cell elements 260, 265 the state parameter values can include different sets of resistance values. For example, the first MTJ cell element 260 can have a first low resistance value $R_1p$ and a first high resistance value $R_1ap$, and the second MTJ cell element 265 can have a second low resistance value $R_2p$ and a second high resistance value $R_2ap$, wherein the four resistance values $R_1p$, $R_1ap$, $R_2p$, $R_2ap$ are all different from one another. In such case four levels of resistance can be achieved by combining each state of two MTJ cell elements. Each of the MTJ cell elements can have two states, two different threshold currents (Isw) and two different resistance variations ($\Delta R$). In aspects, the difference in the two states, the two different threshold currents and the two difference resistance variations can be obtained by either varying the thermal stability factor of each MTJ cell element 260, 265, by varying a damping parameter of each MTJ cell element's free layer, or by varying the tunnel barrier properties of each MTJ cell element. For example, the thermal stability factor of each MTJ cell element can be varied by variations in the interfacial anisotropy, element size, saturation magnetization, and/or the like.

The four resistance states can be uniquely defined by the combination of the relative magnetization of the two MTJ cell elements. As illustrated in Table 1, an MBC 205, including two MTJ cell elements 260, 265, can have four combinations of resistance values:

TABLE 1

| MTJ1 | MTJ2 | MBC |
|------|------|-----|
| $R_1p$ | $R_2p$ | $R_1$ |
| $R_1p$ | $R_2ap$ | $R_2$ |
| $R_1ap$ | $R_2p$ | $R_3$ |
| $R_1ap$ | $R_2ap$ | $R_4$ |

Figure 4A:
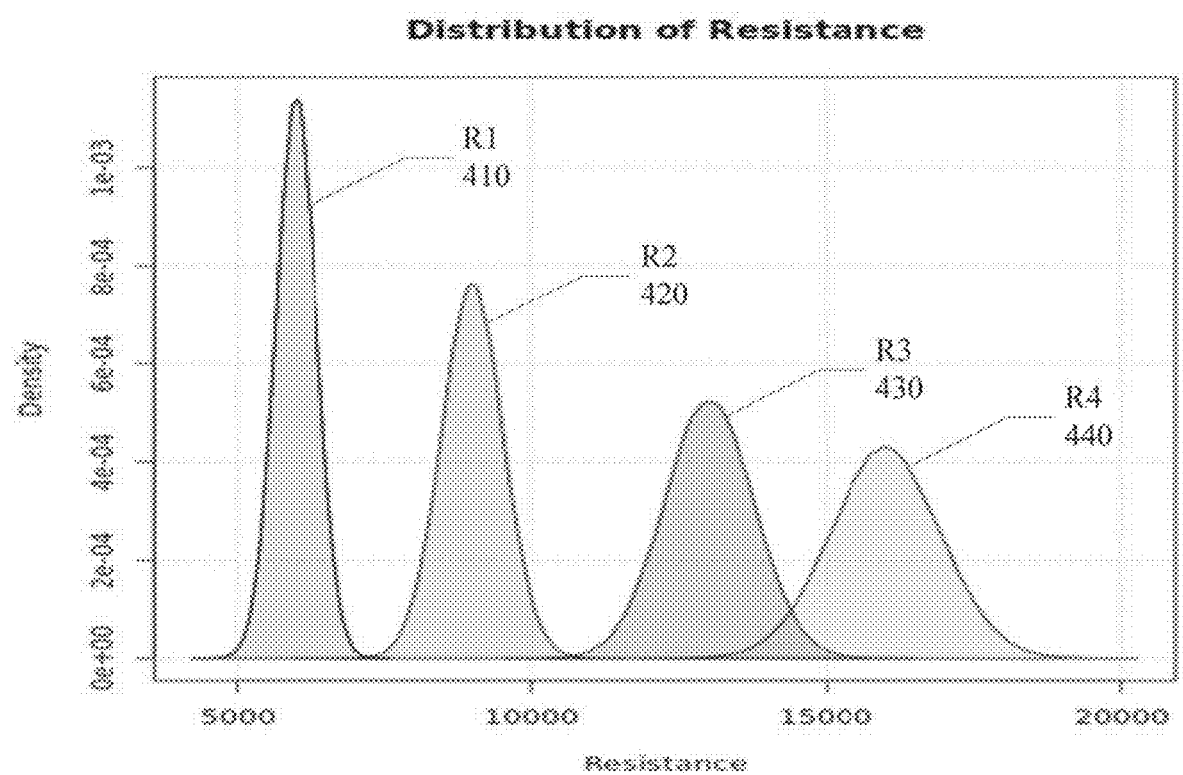
FIGS. 4A and 4B show characteristics of a MBC with a standard state readout scheme, in accordance with aspects of the present technology.

The MBC 205 including two MTJ cell elements 260, 265 can therefore exhibit four resistance values R1, R2, R3 and R4. As illustrated in FIG. 4A, the MBC can have a distribution of resistance values 410-440 for each of the four states as a result of process variations in the access element 270 and the MTJ cell elements 260, 265. Overlapping of the resistance distribution can result in read errors.

Figure 4B:
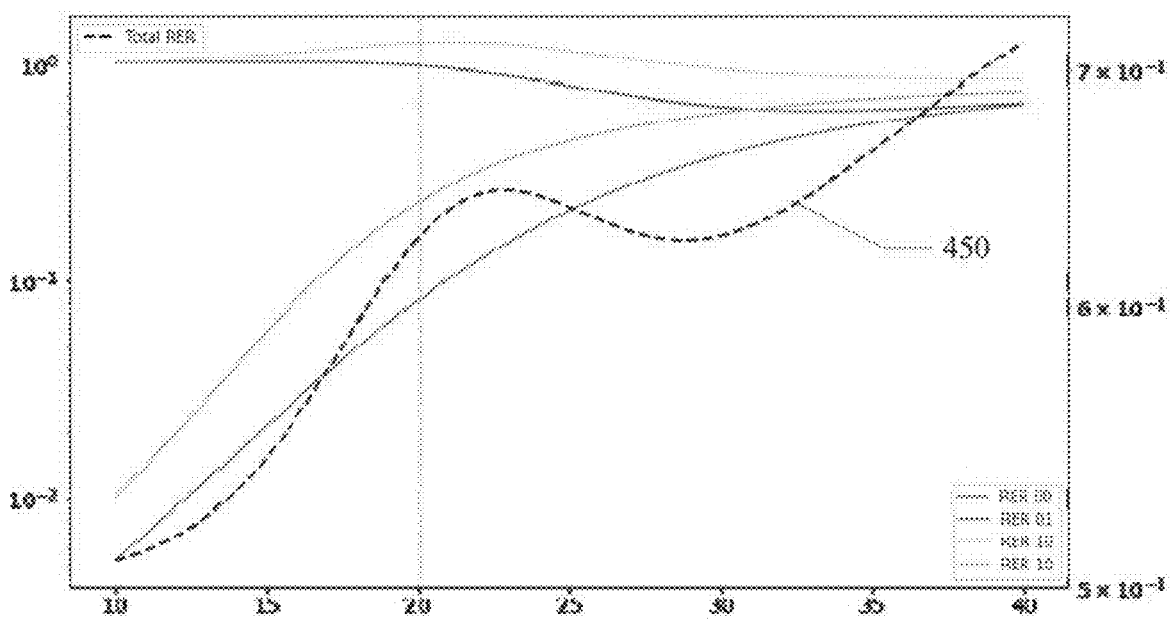

Referring now to FIG. 4B, a graph illustrating an exemplary relationship between the size of an MTJ and read error rate is shown. Although it may seem that the separation between the resistive states can be increased to reduce the overlap between the state, it may not be possible to achieve such a result. As illustrated by the dashed line 450, the Read Error Rate may typically be greater than $10^{-1}$ whenever the size of the MTJ is larger than approximately 20 nm, which is typically not acceptable for commercial implementations.

In aspects, the one or more memory circuits 120-170 can be configured to sequentially apply different successive sets of state programming conditions to a selected plurality of the MBCs 205. In one implementation, the selected plurality of MBCs 205 can be a byte, word, page, code word or the like number of MBCs 205. The respective sets of state programming conditions can program a corresponding one of the plurality of cell elements in the selected plurality of MBCs 205 to a respective state parameter value. In one implementation, a first set of state programming conditions can be selected to change the state of the first cell element 260 from a first state to a second state, without changing the state of the second cell element 265. The second set of state programming conditions can be selected to change the state of the second cell element 265 from a first state to a second state. The second set of state programming conditions can also change the state of the first cell element 260 from a first state to a second state, and therefore, the first set of programming conditions and the second set of programming conditions are sequentially applied.

Figure 5A:
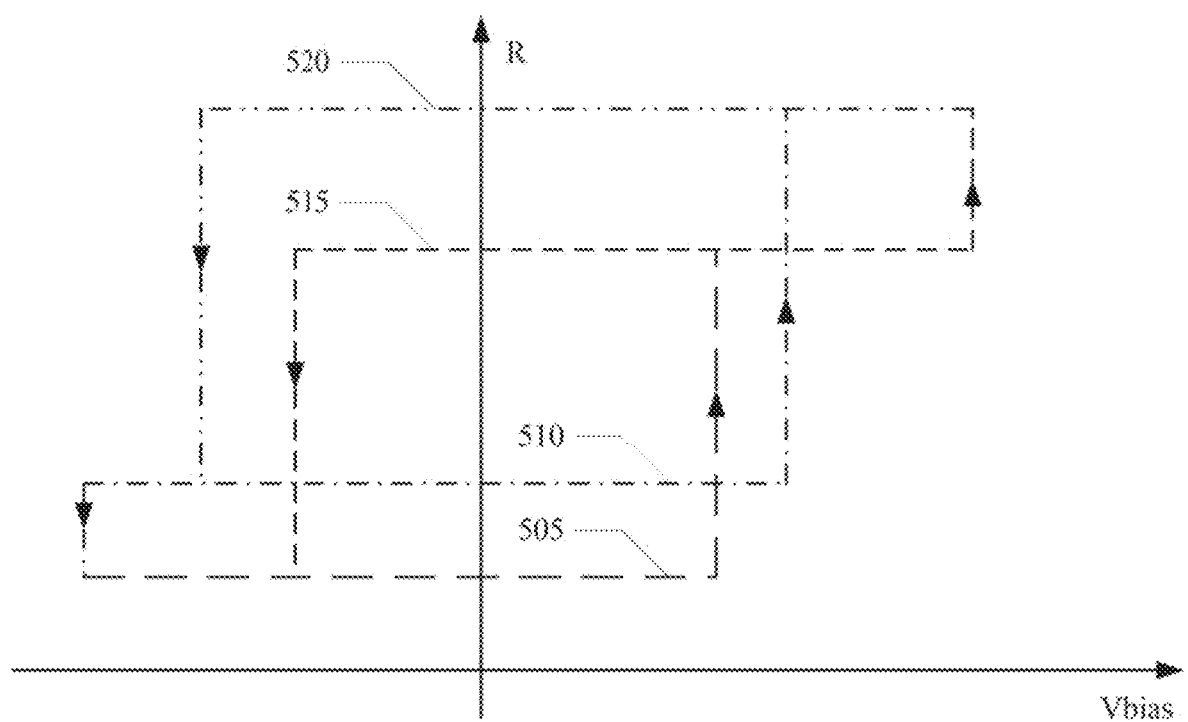
FIGS. 5A-5E show a diagram illustrating state parameter values and transitions therebetween of a MBC, in accordance with aspects of the present technology.
Figure 5B:
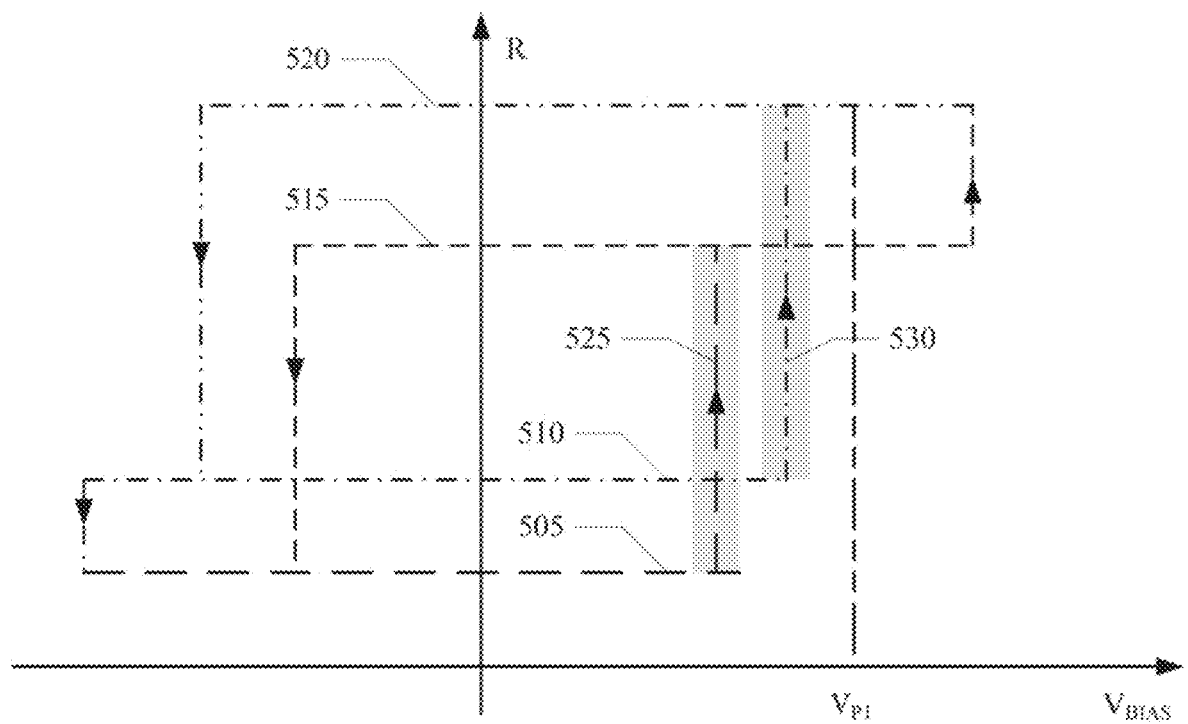
Figure 5C:
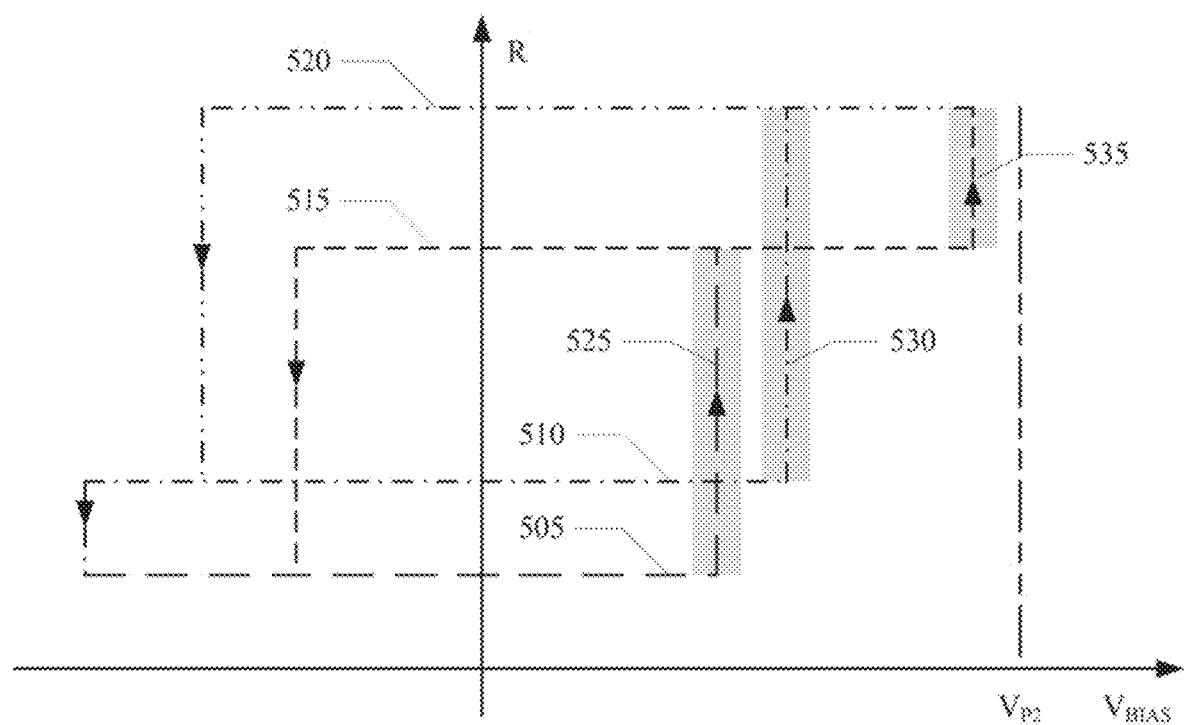

In an exemplary implementation, the MBCs 205 can include a plurality of MTJ cell elements, and the successive sets of state programming conditions can apply a bias voltage to respective word lines, and a bias current to respective bit lines. Each respective set of word line bias voltages and bit line bias currents can program a corresponding one of the plurality of cell elements 260, 265 to a respective resistance state. Referring now to FIGS. 5A-5E, a diagram illustrating state parameter values and transitions therebetween of a MBC, in accordance with aspects of the present technology, is shown. The cell elements of the MBC can have different sets of state parameter values, and therefore the MBC can have unique state parameters and unique transitions therebetween. For example, if the MBC includes a first cell element having resistance states $R_1p$ and $R_1ap$ and a second cell element having resistance states $R_2p$ and $R_2ap$, the MBC can have four unique resistance values $R_1$ 505, $R_2$ 510, $R_3$ 515 and $R_4$ 520. In addition, the transitions between the resistance states can also be unique. For example, a first positive programming voltage ($V_{P1}$) can change the state of the first cell element from the $R_1p$ state to the $R_1ap$ state, but not change the state of the second cell element. If the second cell element is in the $R_2p$ state, the MBC can transition 525 from the $R_1$ state 505 to the $R_3$ state 515. However, if the second cell element is in the $R_2ap$ state, the MBC can transition 530 from the $R_2$ state 510 to the $R_4$ state 520, as illustrated in FIG. 5B. Similarly, a second positive programming voltage ($V_{P2}$) can change the state of the second cell element from the $R_2p$ state to the $R_2ap$ state. In such case, the MBC can transition 535 from any one of the $R_1, R_2, R_3$ states 505, 510, 515 to the $R_4$ state 520, as illustrated in FIG. 5C.

Similarly, the MBC can have unique transitions between resistive states in response to successive sets of reverse polarity programming voltages. For example, a first negative programming voltage ($-V_{P1}$) can change the state of the first cell element from the $R_1ap$ state to the $R_1p$ state, but not change the state of the second cell element. If the second cell element is in the $R_2ap$ state, the MBC can transition from the $R_4$ state 520 to the $R_2$ state 510. However, if the second cell element is in the $R_2p$ state, the MBC can transition from the $R_3$ state 515 to the $R_1$ state 505. Similarly, a second negative programming voltage ($-V_{P2}$) can change the state of the second cell element from the $R_2ap$ state to the $R_2p$ state. In such case, the MBC can transition 535 from any one of the $R_4, R_3, R_2$ states 520, 515, 510 to the $R_1$ state 505.

Figure 5D:
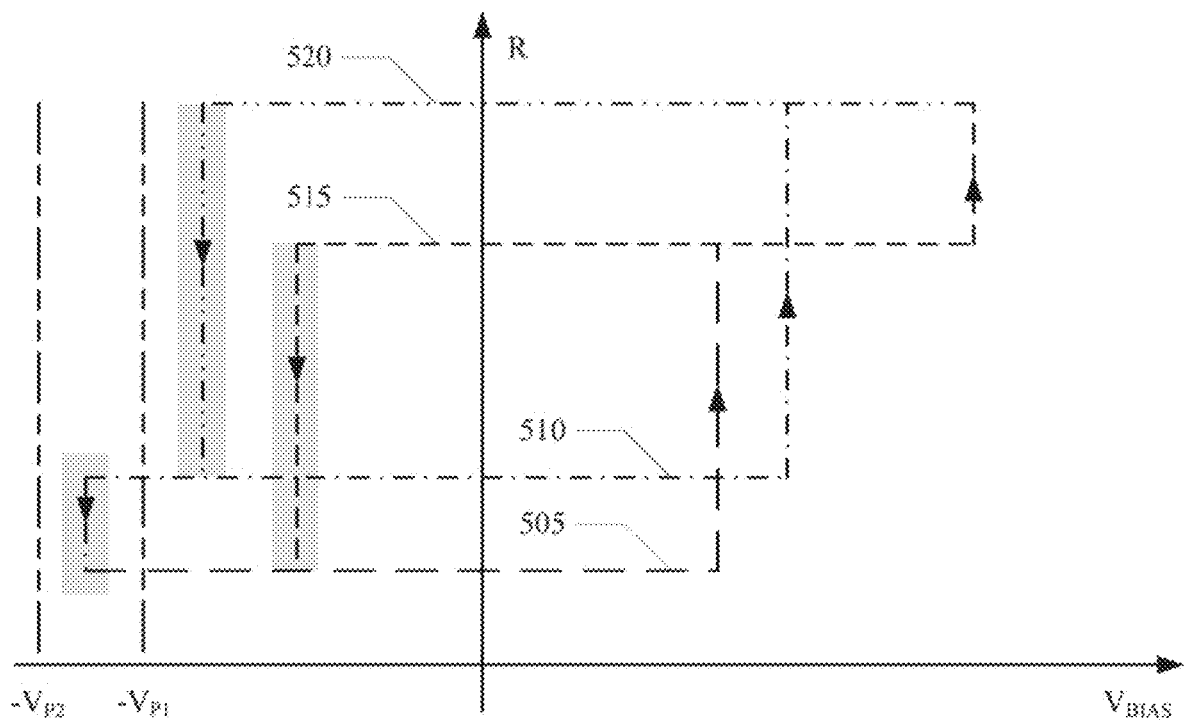

Based on the successive sets of state programming conditions applied and the detection of transitions between state parameters, it is possible to determine the read state of the MBC 205, as illustrated in FIG. 5D. For example, if a state transition 525, 530 is detected in response to the first set of programming voltages ($V_{P1}$) and another state transition 535 is detected in response to the second set of programming voltages ($V_{P2}$), then the MBC read state was originally in the first resistance state $R_1$. If a state transition 525, 530 is detected in response to the first set of programming voltages ($V_{P1}$), but another state transition is not detected in response to the second set of programming voltages ($V_{P2}$), then the MBC read state was originally in the second resistance state $R_2$. If a state transition is not detected in response to the first set of programming voltages ($V_{P1}$), but a state transition 535 is detected in response to the second set of programming voltages ($V_{P2}$), then the MBC read state was originally in the third resistance state $R_3$. If no state transition is detected in response to both the first and second set of programming voltages ($V_{P1}, V_{P2}$), then the MBC read state was originally in the fourth resistance state $R_4$. Accordingly, the described destructive self-reference sensing technique can be used to read the selected plurality of MBCs. The self-reference technique can be used to reduce the effects of bit-to-bit process variations in the cell elements when reading the MBCs.

Figure 5E:
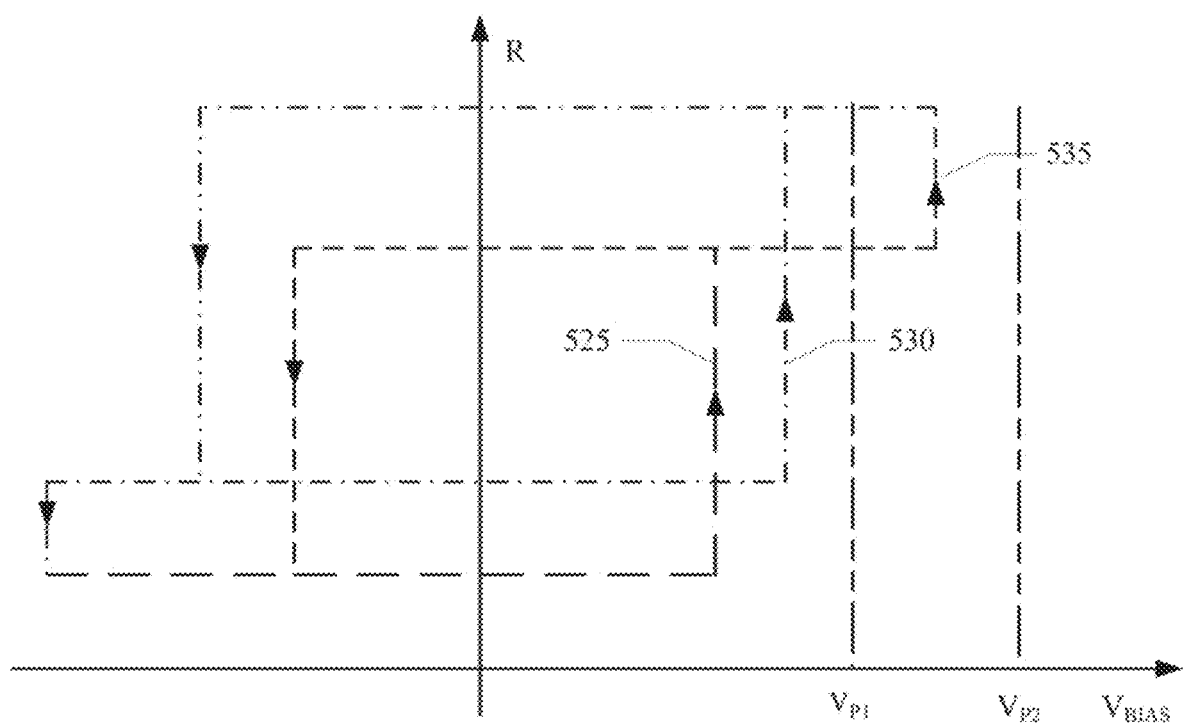

In aspects, the margins between the resistive state transitions 525-535 can be asymmetric. In an MTJ based MBC implementation, the margins between the resistive state transitions can be adjusted by adjusting the fringe fields between the magnetic layers of the individual MTJs of the MBC, as illustrated in FIG. 5E. In aspects, if a given margin between the resistive state transitions 525-535 is relatively wide, a relatively short programming current pulse can be applied to the MBC. However, if the given margin between the resistive state transitions 525-535 is relatively narrow, a relatively longer programming current pulse can be applied to the MBC.

Referring again to FIG. 1, the one or more memory circuits 120-170 can be configured to determine a state change result for the selected plurality of MBCs after applying each of the set of programming conditions. In one implementation, the state of the MBC can be read before applying a first set of state programming conditions, the state of the MBC can be read after applying the first set of state programming conditions, and then a first state change condition can be determined based on the read state of the MBC before and after applying the first set of state programming conditions. A second set of state programming conditions can be applied, the state of the MBC can be read after applying the second set of state programming conditions, and then a second state change condition can be determined based on the read state of the MBC before and after applying the second set of state programming conditions.

In an exemplary implementation, the one or more memory circuits 120-170 can be configured to bias the bit lines of the selected plurality of MBCs with a sense current and sense a first instance of a source line voltage of the plurality of MBCs. The one or more memory circuits 120-170 can then be configured to apply a first programming current to the selected plurality of MBCs. The one or more memory circuits 120-170 can then be configured to bias the bit lines of the selected plurality of MBCS with the sense current and sense a second instance of the source line voltage of the plurality of MBCs.

The one or more memory circuits 120-170 can be configured to again bias the bit lines of the selected plurality of MBCs with the sense current and sense a third instance of a source line voltage of the plurality of MBCs. The one or more memory circuits 120-170 can then be configured to apply a second programming current to the selected plurality of MBCs. The one or more memory circuits 120-170 can then be configured to bias the bit lines of the selected plurality of MBCs with the sense current and sense a fourth instance of the source line voltage of the plurality of MBCs.

The one or more memory circuits 120-170 can be configured to determine the read state of the selected plurality of MBCs based on a presence or absence of a change between the first instance of the source line voltage and the second instance of the source line voltage, and a presence or absence of a change between the third instance of the source line voltage and the fourth instance of the source line voltage. Accordingly, each MTJ is compared to itself under the same applied bias conditions. Therefore, a better sense margin can be provided and the use of a MTJ reference can be eliminated.

Figure 6:
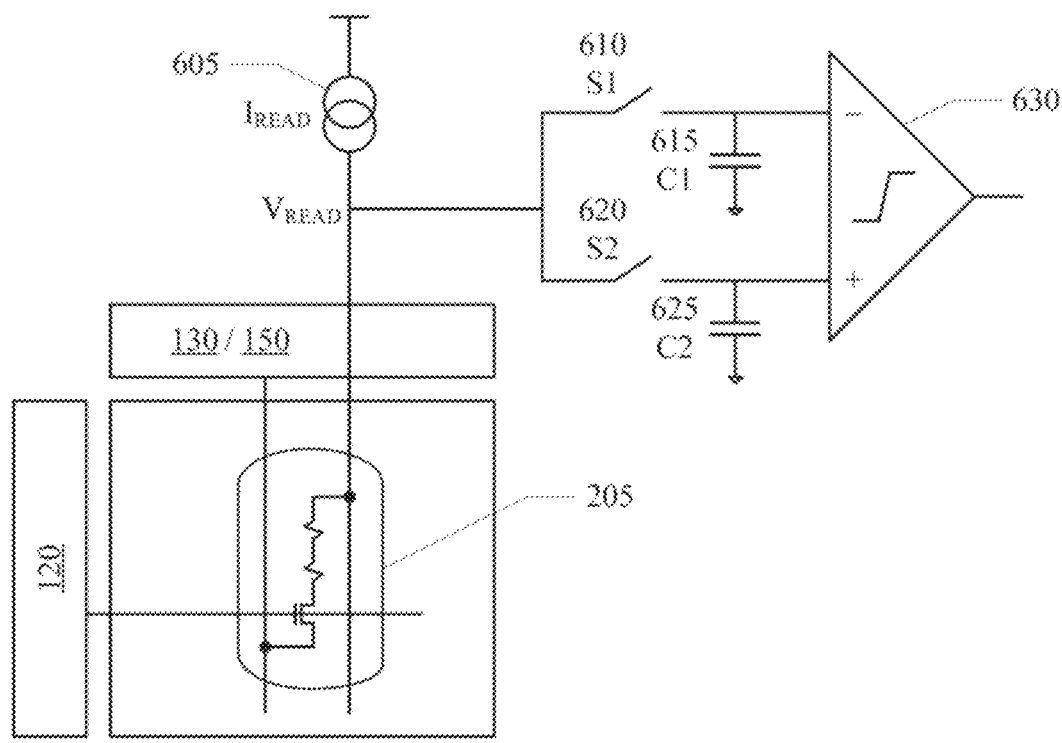
FIG. 6 shows a sense circuit, in accordance with aspects of the present technology.

Referring now to FIG. 6, a sense circuit, in accordance with aspects of the present technology, is shown. The sense circuit is described herein with reference to sensing a single MBC 205. However, the sense circuit can be duplicated to sense a byte, a word, a page or the like number of MBCs. The sense circuit can include a current source 605 to apply a fixed current to a MBC 205. A first switch (S1) 610 and a first capacitor (C1) 615 can be coupled together and configured to store the first instance of the sense level of the of the MBC 205, before the cell is sequentially programmed. A second switch (S2) 620 and a second capacitor (C2) 625 can be coupled together and configured to store the second instance of the sense level, after the cell is sequentially programmed. A comparator 630 can be coupled to the first switch 610 and the first capacitor 615, and to the second switch 620 and the second capacitor 625. The comparator 630 can be configured to compare the second instance of the sense level store on the second capacitor 625 to the first instance of the sense level stored on the first capacitor 615.

Figure 7:
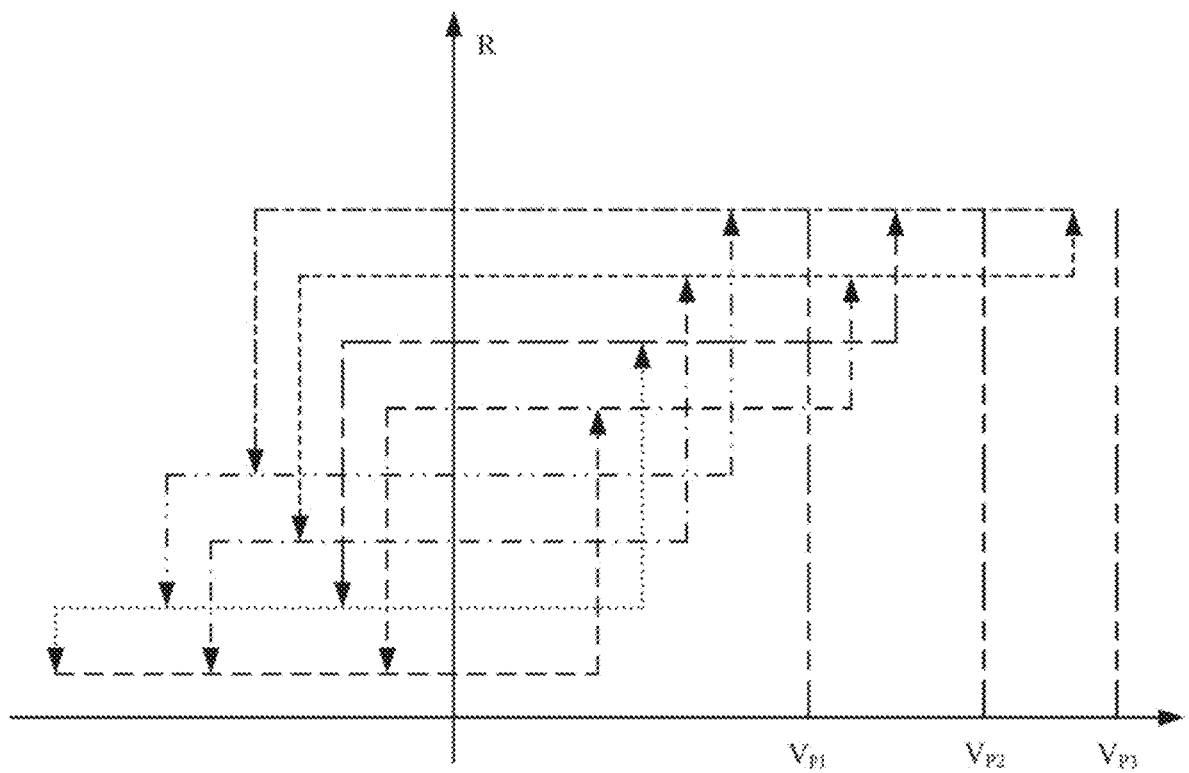
FIG. 7 shows a diagram illustrating state parameter values and transitions therebetween of a MBC, in accordance with aspects of the present technology.

Determining the read state of the selected plurality of MBCs can be further extended to MBCs including more than two cell elements. Referring now to FIG. 7, a diagram illustrating state parameter values and transitions therebetween of a MBC, in accordance with aspects of the present technology, is shown. In one implementation, a first set of programming parameters ($V_{P1}$) can be selected to change the state of a first cell element, a second set of programming parameters ($V_{P2}$) can be selected to change the state of a second cell element, and a third set of programming parameters ($V_{P3}$) can be selected to change the state of a third cell element. For example, the one or more memory circuits 120-170 can be configured to bias the bit lines of the selected plurality of MBCs with a sense current and sense a first instance of a source line voltage of the selected plurality of MBCs. The one or more memory circuits 120-170 can then be configured to bias the selected plurality of MBCs with a first programming current or programming bias voltage. The one or more memory circuits 120-170 can then be configured to bias the bit lines of the selected plurality of MBCs with the sense current and sense a second instance of the source line voltage of the selected plurality of MBCs.

The one or more memory circuits 120-170 can be configured to bias the bit lines of the selected plurality of MBCs with the sense current and sense a third instance of the source line voltage of the selected plurality of MBCs. The one or more memory circuits 120-170 can then be configured to bias the selected plurality of MBCs with a second programming current or programming bias voltage. The one or more memory circuits 120-170 can then be configured to bias the bit lines of the selected plurality of MBCs with the sense current and sense a fourth instance of the source line voltage of the selected plurality of MBCs.

The one or more memory circuits 120-170 can be configured to bias the bit lines of the selected plurality of MBCs with the sense current and sense a fifth instance of the source line voltage of the selected plurality of MBCs. The one or more memory circuits 120-170 can then be configured to bias the selected plurality of MBCs with a third programming current or programming bias voltage. The one or more memory circuits 120-170 can then be configured to bias the bit lines of the selected plurality of MBCs with the sense current and sense a sixth instance of the source line voltage of the selected plurality of MBCs.

The one or more memory circuits 120-170 can be configured to determine the read state of the selected plurality of MBCs based on a presence or absence of a change between the first and second instances of the source line voltage, a presence or absence of a change between the third and fourth instances of the source line voltage, and a presence or absence of a change between the fifth and sixth instances of the source line voltage.

Figure 8:
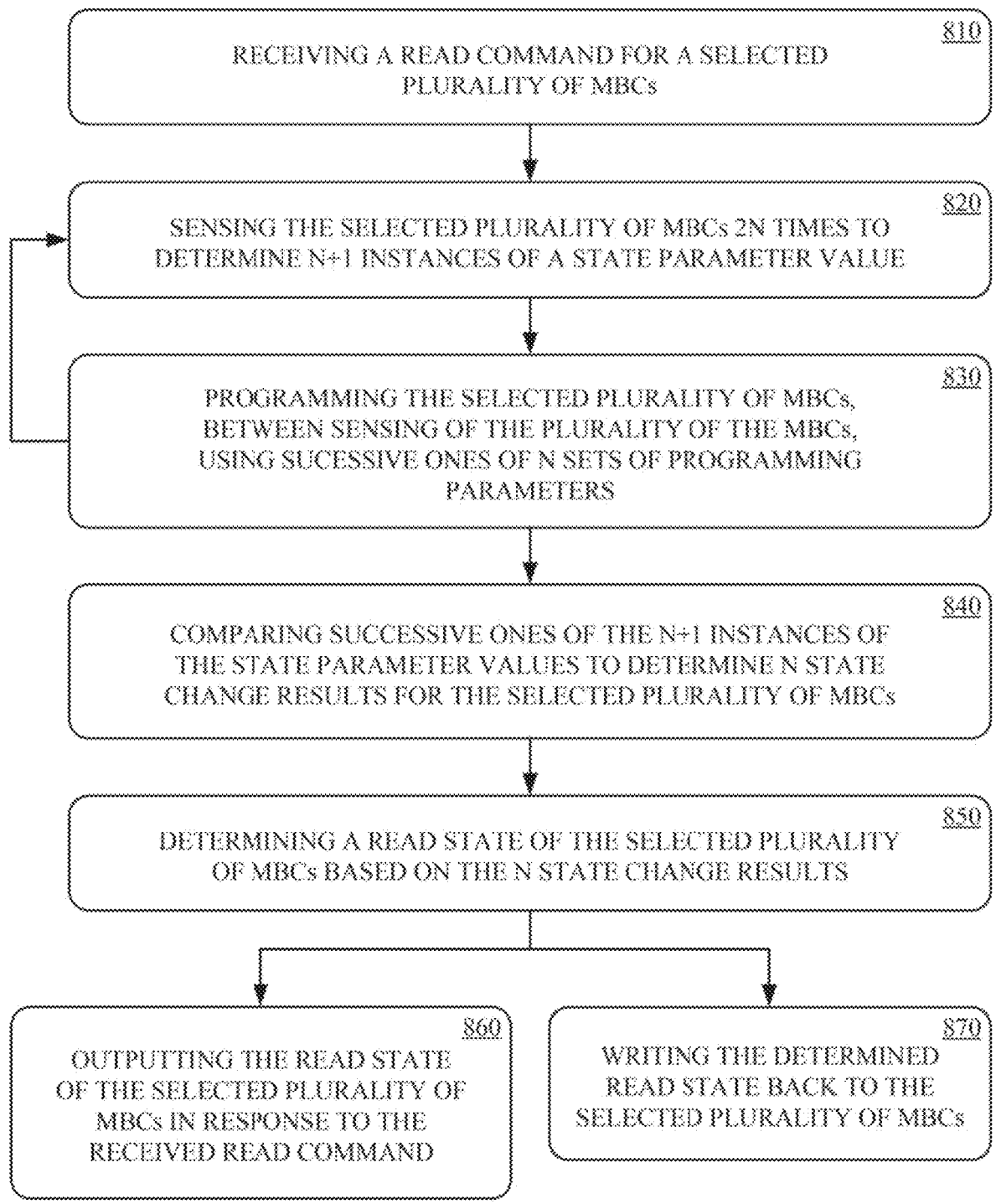
FIG. 8 shows a method of reading a MBC memory device, in accordance with aspects of the present technology.

Referring now to FIG. 8, a method of reading a Multi-Bit Cell (MBC) memory device, in accordance with aspects of the present technology, is shown. The memory device can include an array of MBCs and one or more memory circuits. The MBCs can include a number (N) of cell elements coupled in series. The cell elements can have two different states, such that the MBCs have $2^N$ states.

In aspects, the memory device can receive a read command for a selected plurality of MBCs, at 810. The read command can be received from a processing unit, such as a central processing unit (CPU), a graphics processing unit (GPU), digital signal processor (DSP), micro-controller or the like. The selected plurality of MBCs can be a computing device readable byte, word, page, code word, of the like portion of the MBC array.

In aspects, the memory device can sense the selected plurality of MBCs N+1 times to determine N+1 instance of a state parameter value, at 820. The memory device can program the selected plurality of MBCs, between sensing of the selected plurality of the MBCs, using successive ones of N sets of programming parameters, at 830. In one implementation, a first one of the sets of programming parameters can be selected to switch a first one of the plurality of cell elements from one state to the other state of the first cell element. A second one of the sets of programming parameters can be selected to switch a second one of the cell elements from one state to the other state of the second cell element. For MBCs including additional cell elements, successive ones of the N sets of programming parameter can be selected to switch successive ones of the cell elements.

In an exemplary implementation, the MBCs can include N MTJs coupled in series. The selected plurality of MBCs can be biased with a sense current, and a first instance of a resulting voltage can be sensed. A first programming current can then be applied to the selected plurality of MBCs. The selected plurality of MBCs can then be biased with a sense current, and a second instance of the resulting voltage can be sensed. The selected plurality of MBCs can continue to be programmed using successive programming currents for a total of N times, and sensed to detect N+1 corresponding instances of the sense voltage. The successive programming currents can be selected to sequentially program each of the N MTJs to corresponding known states.

The memory device can compare successive ones of the N+1 instances of the state parameter value to determine N state change results for the selected plurality of MBCs, at 840. In one instance, the first instance of the sense voltage can be compared with the second instance of the sense voltage to determine the presence or absence of a change in the sense voltage. The memory device can determine a read state of the selected plurality of MBCs based on the N state change results, at 850. The read state of the selected plurality of MBCs can be determined from the unique combination of the results of the N state change determinations. In an exemplary implementation, a lookup table, as illustrated in Table 2, can be accessed to map the state change determination results to a given read state of the MBC.

TABLE 2

| State Change in Response to 1$^{st}$ Set of Programming Parameters | State Change in Response to 2$^{nd}$ Set of Programming Parameters | Read State of MBC |
|---|---|---|
| N | N | 11 |
| Y | N | 10 |
| N | Y | 01 |
| Y | Y | 00 |

The memory device can output the read state of the selected plurality MBCs in response to the received read command, at 860. The memory device can also write the determined read state back to the selected plurality of MBCs, at 870. The read operation is a destructive read as a result of the successive programming of the selected plurality of MBCs at 830. Therefore, the determined read state can be written back to the selected plurality of MBCs to restore the state of the MBCs to their original state prior to the read operation.

Figure 9A:
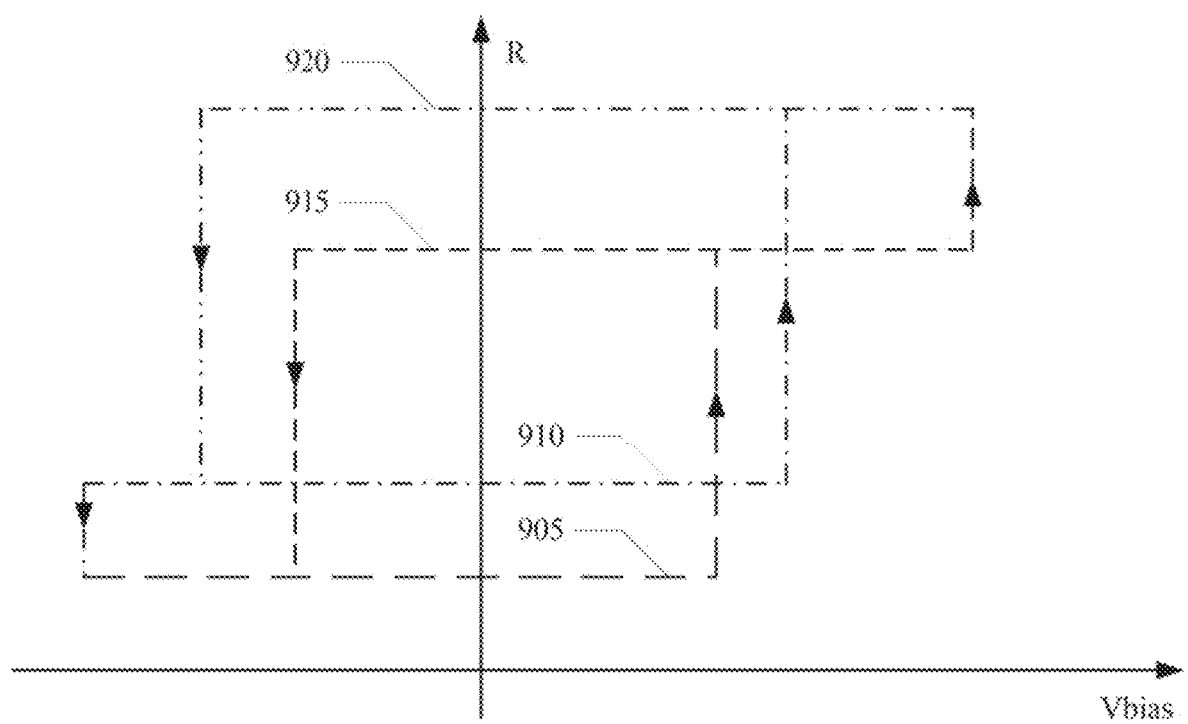
FIGS. 9A-9D show a diagram illustrating state parameter values and transitions therebetween of a MBC, in accordance with aspects of the present technology.
Figure 9B:
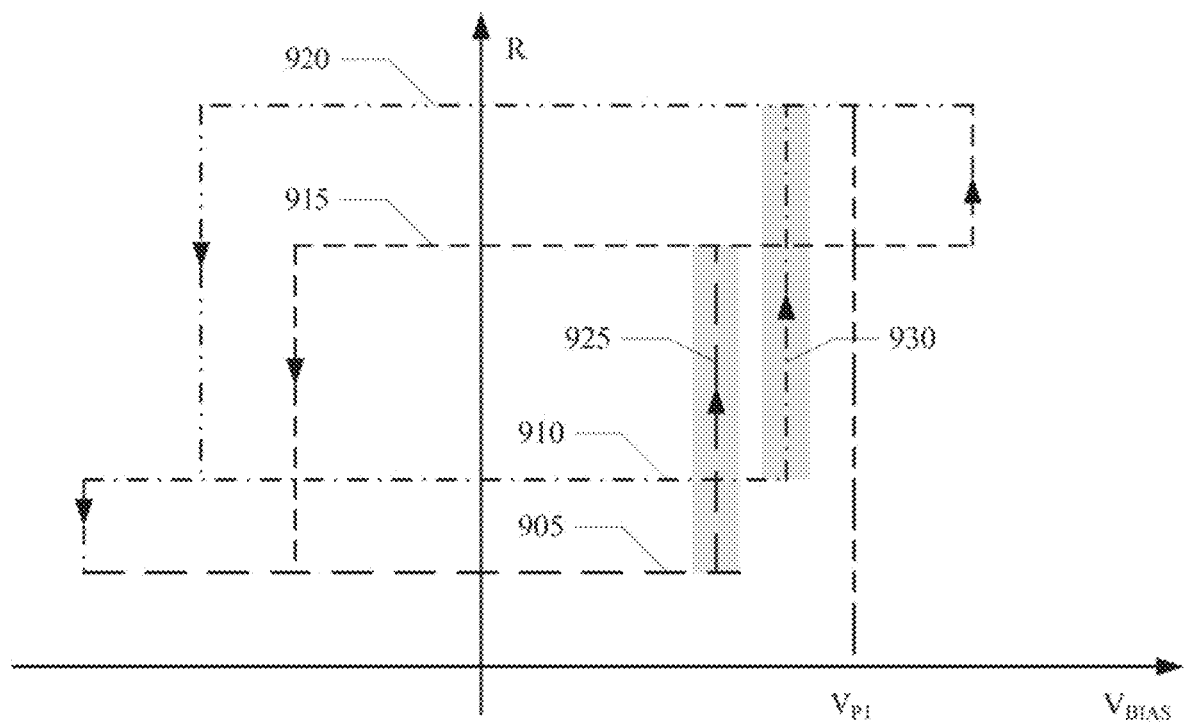
Figure 9C:
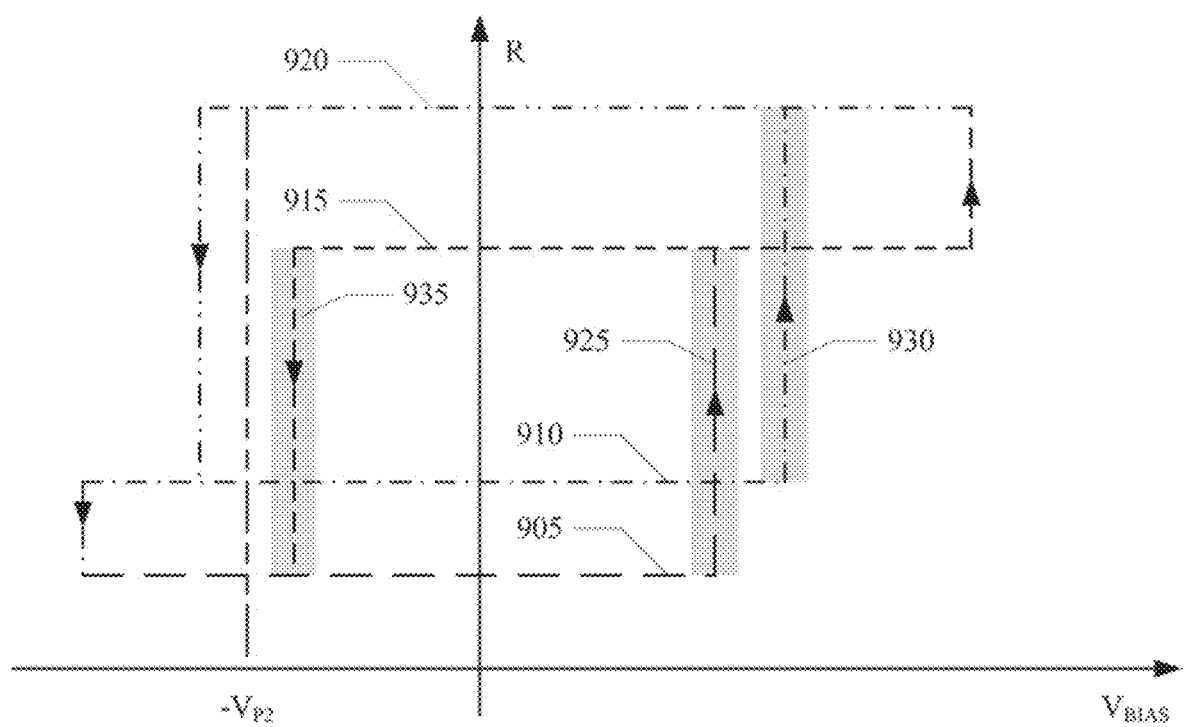

Referring now to FIGS. 9A-D, a diagram illustrating state parameter values and transitions therebetween of a MBC, in accordance with aspects of the present technology, is shown. Again, the cell elements of the MBC can have different sets of state parameter values, and therefore the MBC can have unique state parameters and unique transitions therebetween. For example, if the MBC includes a first cell element having resistance states $R_1ap$ and $R_1p$ and a second cell element having resistance states $R_2ap$ and $R_2p$, the MBC can have four unique resistance values $R_1$ 905, $R_2$ 910, $R_3$ 915 and $R_4$ 920. In addition, the transitions between the resistance states can also be unique. For example, a first positive programming voltage ($V_{P1}$) can change the state of the first cell element from the $R_1p$ state to the $R_1ap$ state, but not change the state of the second cell element. If the second cell element is in the $R_2p$ state, the MBC can transition 925 from the $R_1$ state 905 to the $R_3$ state 915. However, if the second cell element is in the $R_2ap$ state, the MBC can transition 930 from the $R_2$ state 910 to the $R_4$ state 920, as illustrated in FIG. 9B. Similarly, a first negative programming voltage ($-V_{P2}$) can change the state of the first cell element from the $R_1ap$ state back to the $R_1p$ state, but not change the state of the second cell element. If the second cell element is in the $R_2p$ state, the MBC can transition 935 from the R3 state 915 to the R1 state 905, as illustrated in FIG. 9C. However, if the second cell is in the $R_2ap$ state, the MBC cannot transition from the R4 state 920 to the R2 state 910.

Based on the successive sets of state programming conditions applied to flip a given cell and the detection of transitions between state parameters, it is possible to determine the read state of the MBC 205. In one implementation, the given cell can be the smaller of the two MTJ cells that is flipped to read the state of the MBC 205. For example, if a state transition 925, 930 is detected in response to the first set of programming voltages ($V_{P1}$) and another state transition 935 is detected in response to the second set of programming voltages ($-V_{P2}$), then the MBC read state was originally in the first resistance state $R_1$. If a state transition 925, 930 is detected in response to the first set of programming voltages ($V_{P1}$), but another state transition is not detected in response to the second set of programming voltages ($-V_{P2}$), then the MBC read state was originally in the second resistance state $R_2$. If a state transition is not detected in response to the first set of programming voltages ($V_{P1}$), but a state transition 935 is detected in response to the second set of programming voltages ($-V_{P2}$), then the MBC read state was originally in the third resistance state $R_3$. If no state transition is detected in response to both the first and second set of programming voltages ($V_{P1}$, $-V_{P2}$), then the MBC read state was originally in the fourth resistance state $R_4$. Accordingly, the described destructive resistance toggling sensing technique can be used to read the selected plurality of MBCs. The resistance toggling technique can be used to reduce the effects of bit-to-bit process variations in the cell elements when reading the MBCs.

Figure 9D:
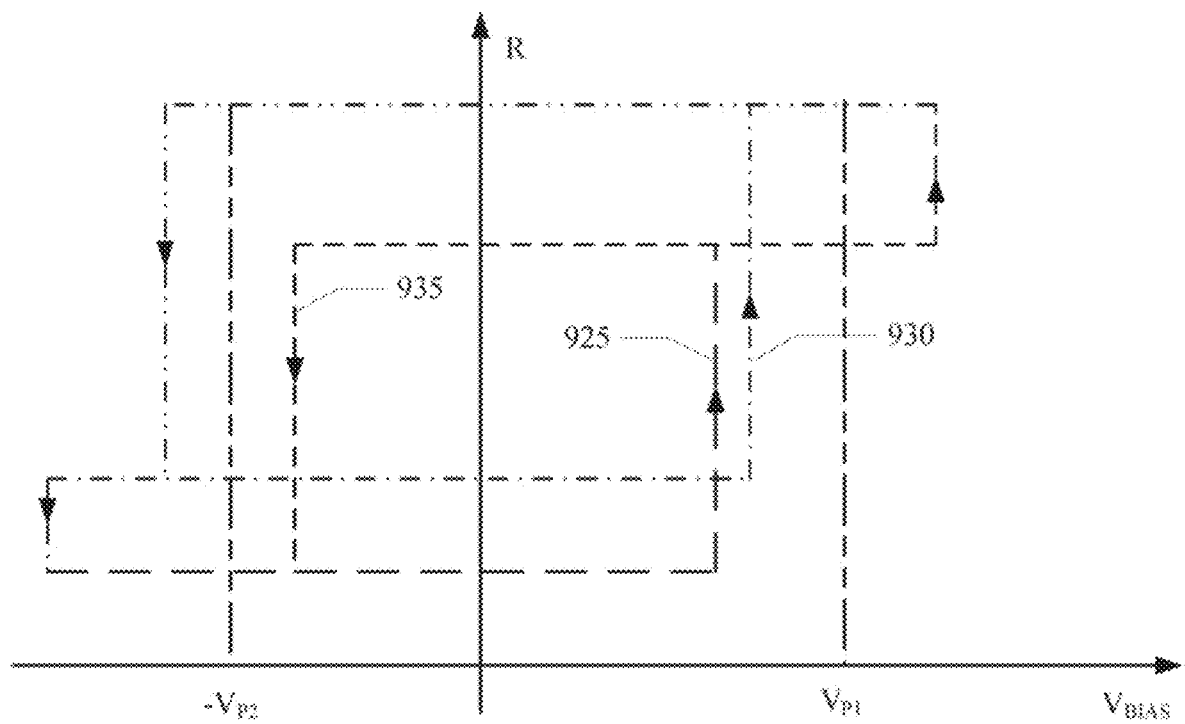

In aspects, the margins between the resistive state transitions 925-935 can be asymmetric. In an MTJ based MBC implementation, the margins between the resistive state transitions can be adjusted by adjusting the fringe fields between the magnetic layers of the individual MTJs of the MBC, as illustrated in FIG. 9D. In aspects, if a given margin between the resistive state transitions 925-935 is relatively wide, a relatively short programming current pulse can be applied to the MBC. However, if the given margin between the resistive state transitions 925-935 is relatively narrow, a relatively longer programming current pulse can be applied to the MBC.

Referring again to FIG. 1, the one or more memory circuits 120-170 can be configured to determine a state change result for the selected plurality of MBCs after applying each of the set of programming conditions to toggle a given cell. In one implementation, the state of the MBC can be read before applying a first set of state programming conditions to program the given cell to a first known state, the state of the MBC can be read after applying the first set of state programming conditions, and then a first state change condition can be determined based on the read state of the MBC before and after applying the first set of state programming conditions. A second set of state programming conditions can be applied to program the given cell to a second known state, the state of the MBC can be read after applying the second set of state programming conditions, and then a second state change condition can be determined based on the read state of the MBC before and after applying the second set of state programming conditions.

In an exemplary implementation, the one or more memory circuits 120-170 can be configured to bias the bit lines of the selected plurality of MBCs with a sense current and sense a first instance of a source line voltage of the plurality of MBCs. The one or more memory circuits 120-170 can then be configured to apply a first programming current to the selected plurality of MBCs to program the first cell to a first state. The one or more memory circuits 120-170 can then be configured to bias the bit lines of the selected plurality of MBCs with the sense current and sense a second instance of the source line voltage of the plurality of MBCs.

The one or more memory circuits 120-170 can be configured to again bias the bit lines of the selected plurality of MBCs with the sense current and sense a third instance of a source line voltage of the plurality of MBCs. The one or more memory circuits 120-170 can then be configured to apply a second programming current to the selected plurality of MBCs to program the first cell to a second state. In one implementation, the duration of the first and second programming current pulses are relatively long, with the second programming current pulse being longer than the first programming current pulse. The one or more memory circuits 120-170 can then be configured to bias the bit lines of the selected plurality of MBCs with the sense current and sense a fourth instance of the source line voltage of the plurality of MBCs.

The one or more memory circuits 120-170 can be configured to determine the read state of the selected plurality of MBCs based on a presence or absence of a change between the first instance of the source line voltage and the second instance of the source line voltage, and a presence or absence of a change between the third instance of the source line voltage and the fourth instance of the source line voltage. Accordingly, each MTJ is compared to itself under the same applied bias conditions. Therefore, a better sense margin can be provided and the use of a MTJ reference can be eliminated.

Figure 10:
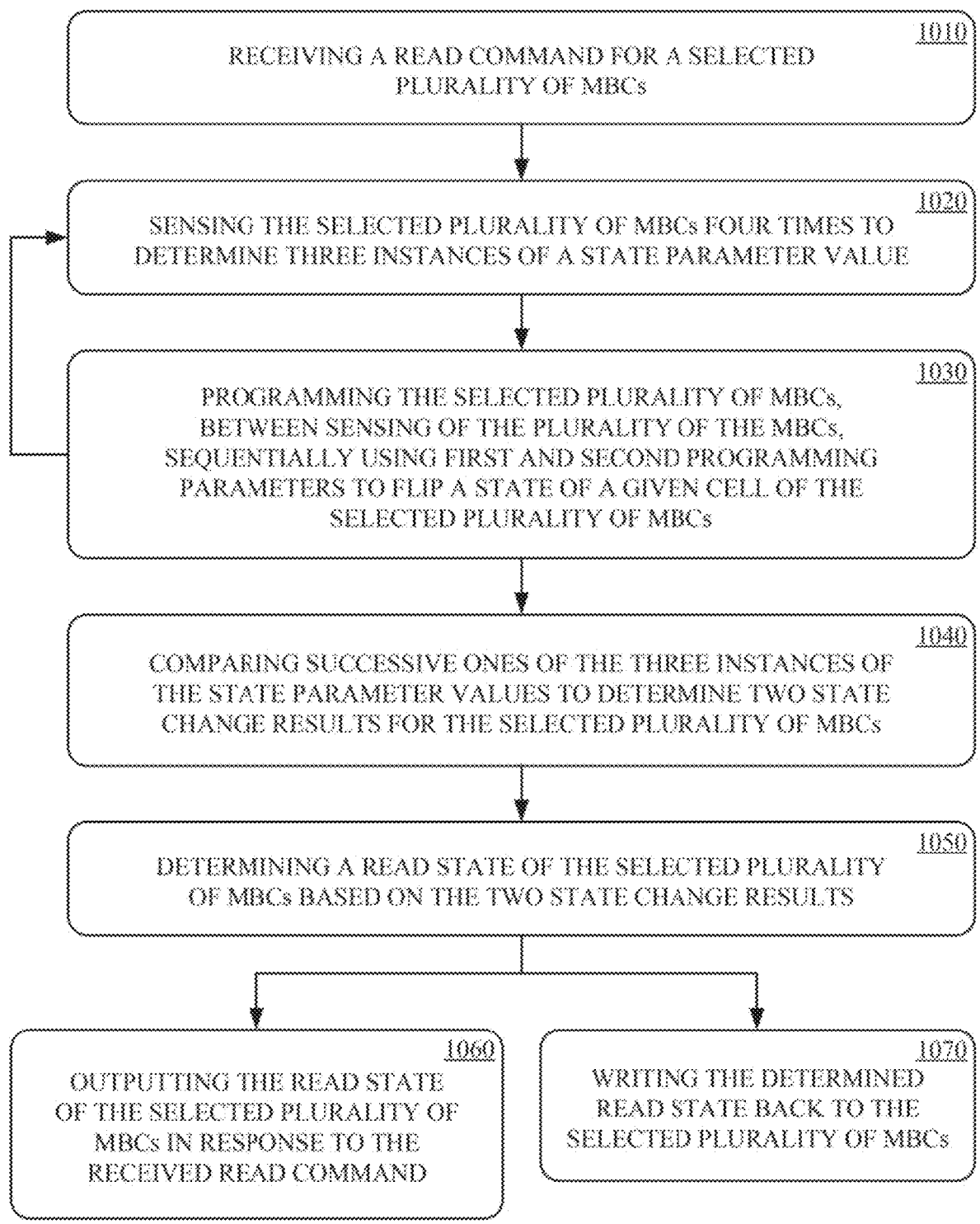
FIG. 10 shows a method of reading a MBC memory device in accordance with aspects of the present technology.

Referring now to FIG. 10, a method of reading a Multi-Bit Cell (MBC) memory device, in accordance with aspects of the present technology, is shown. The memory device can include an array of MBCs and one or more memory circuits. The MBCs can include two cell elements coupled in series. The cell elements can have two different states, such that the MBCs have four states.

In aspects, the memory device can receive a read command for a selected plurality of MBCs, at 1010. The read command can be received from a processing unit, such as a central processing unit (CPU), a graphics processing unit (GPU), digital signal processor (DSP), micro-controller or the like. The selected plurality of MBCs can be a computing device readable byte, word, page, code word, of the like portion of the MBC array.

In aspects, the memory device can sense the selected plurality of MBCs four times to determine three instance of a state parameter value, at 1020. The memory device can program the selected plurality of MBCs, between sensing of the selected plurality of the MBCs, sequentially using a first set of programming parameters and then a second set of programming parameters to flip a state of a given cell of the selected plurality of MBCs, at 1030. In one implementation, a first one of the sets of programming parameters can be selected to program a first one of the plurality of cell elements to a known state. A second one of the sets of programming parameters can be selected to switch the first one of the cell elements from the known state to the other state.

The memory device can compare successive ones of the three instances of the state parameter value to determine two state change results for the selected plurality of MBCs, at 1040. In one instance, the first instance of the sense voltage can be compared with the second instance of the sense voltage to determine the presence or absence of a change in the sense voltage. The memory device can determine a read state of the selected plurality of MBCs based on the two state change results, at 1050. The read state of the selected plurality of MBCs can be determined from the unique combination of the results of the two state change determinations. In an exemplary implementation, a lookup table, as illustrated in Table 3, can be accessed to map the state change determination results to a given read state of the MBC.

TABLE 3

| State Change in Response to $1^{st}$ Set of Programming Parameters | State Change in Response to $2^{nd}$ Set of Programming Parameters | Read State of MBC |
|---|---|---|
| N | N | 11 |
| Y | N | 10 |
| N | Y | 01 |
| Y | Y | 00 |

The memory device can output the read state of the selected plurality MBCs in response to the received read command, at 1060. The memory device can also write the determined read state back to the selected plurality of MBCs, at 1070. The read operation is a destructive read as a result of the successive programming of the selected plurality of MBCs at 1030. Therefore, the determined read state can be written back to the selected plurality of MBCs to restore the state of the MBCs to their original state prior to the read operation.

Figure 11A:
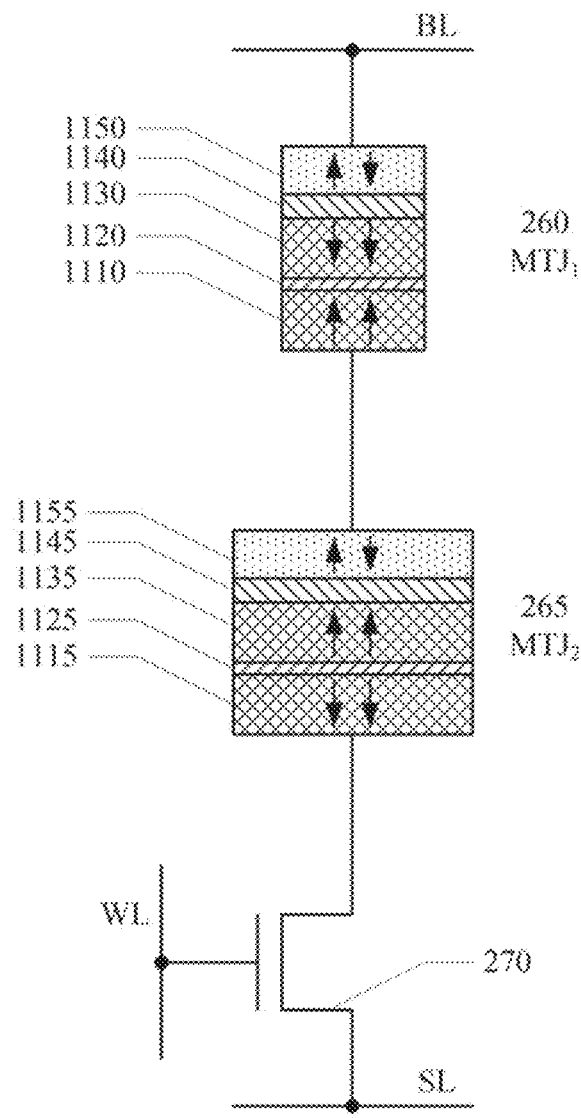
FIGS. 11A and 11B show a memory cell array, in accordance with aspects of the present technology.
Figure 11B:
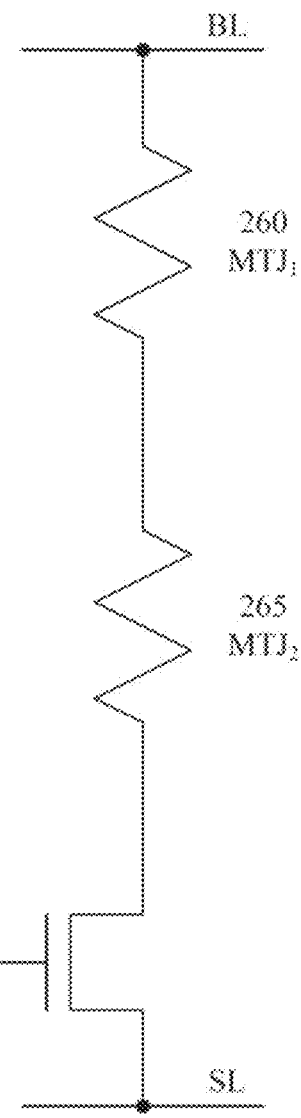

Referring now to FIGS. 11A and 11B, a MBC, in accordance with aspects of the present technology, is shown. The MBC 205 can include a plurality of cell elements 260, 265 and a selector element 270. FIG. 11A illustrates an exemplary structure of a MBC 205 including two MTJ cell elements 260, 265. Each MTJ cell element can include a first fixed magnetic layer 1110, 1115 having a fixed magnetization polarization, a coupling layer 1120, 1125, and a second fixed magnetic layer 1130, 1135 having a fixed magnetization polarization that is coupled antiferromagnetically to the first magnetic layer 1110, 1115 through the coupling layer 1120, 1125. Each MTJ cell element 260, 265 can also include a magnetic tunnel barrier layer 1120 and a free magnetic layer 1125. The free magnetic layer in each MTJ can be selectively switchable between opposite magnetization polarizations.

In aspects, the magnetization polarization of the first fixed magnetic layer 1110, 1115 can be opposite the fixed magnetization polarization of the second fixed magnetic layer 1130, 1135 to prevent the magnetization polarization of the second fixed magnetic layer 1130, 1135 from flipping during writing or reading of the MTJ cell elements 260, 265, while also enabling the switching of the free magnetic layer 1150, 1150 at relatively low currents. The combined magnetization polarization of the first and second fixed magnetic layers 1110, 1130, 1115, 1135 coupled through the coupling layer 1120, 1125 can be referred to as the pinned magnetization polarization of the MTJ cell elements 260, 265. Typically, the pinned magnetization polarization can correspond to the magnetization polarization of the second magnetic layer 1130, 1135 of the MTJ cell elements 260, 265. In aspects, the pinned magnetization polarization of the first MTJ cell element 260 can have an orientation that is opposite of the pinned magnetization polarization of the second MTJ cell element 265, as illustrated in FIG. 11A. For example, the pinned magnetization polarization orientation of the first MTJ cell element 260 may be in a first direction (e.g. down) corresponding to the magnetization polarization of the second magnetic layer 1130 of the first MTJ cell element 260, and the pinned magnetization polarization orientation of the second MTJ cell element 265 may be in a second direction (e.g. up) corresponding to the magnetization polarization of the second magnetic layer 1135 of the second MTJ cell element 265.

In another implementation, the MTJ cell elements 260, 265 can include a single fixed magnetic layer 1130, 1135, with the pinned magnetization polarization of the MTJ cell elements 260, 265 corresponding to the magnetization polarization of the single fixed magnetic layer 1130, 1135. In such an implementation, the magnetization polarization (e.g., down) of the fixed magnetic layer 1130 of the first MTJ cell element 260 can have an orientation that is opposite the magnetization polarization (e.g., up) of the fixed magnetic layer 1135 of the second MTJ cell element 265. In other implementations, the MTJ cell elements 260, 265 can include any number of fixed magnetic layers, with the corresponding pinned magnetization polarization of the first MTJ cell element 260 opposite the pinned magnetization polarization of the second MTJ cell element 265.

In one implementation, the free magnetic layer 1150, 1155 can be a Cobalt-Iron-Boron (CoFeB) layer, the magnetic tunnel barrier layer 1140, 1145 can be a Magnesium-Oxide (MgO) layer, the second fixed magnetic layer 1130, 1135 can be a Cobalt-Iron-Boron (CoFeB) layer, the coupling layer 1120, 1125 can be a Ruthenium (Ru) layer, and the first fixed magnetic layer 1110, 1115 can be a Cobalt-Platinum (CoPt) or Cobalt-Nickel (CoNi). One or more additional layers can appear on either side of this structure. In an exemplary implementation, the first MTJ cell element 260 can have a first diameter (D1), and the second MTJ cell element 265 can have a second diameter (D2) that is different from the first diameter (D1). For example, the first MTJ cell element 260 can have a diameter of 40 nanometers (nm) and the second MTJ cell element 265 can have a diameter of 60 nm.

Typically, if the second fixed magnetic layer 1130, 1135 and free magnetic layer 1150, 1155 have the same magnetic polarization (e.g., parallel), the MTJ cell element will exhibit a relatively low resistance value (Rp) corresponding to a '0' bit state; while if the magnetization polarization between the second fixed magnetic layer 1130, 1135 and the free magnetic layer 1150, 1155 are antiparallel, the MTJ cell will exhibit a relatively high resistance value (Rap) corresponding to a '1' bit state.

FIG. 11B illustrates an exemplary resistive equivalence of the MTJ cell elements 260, 265. For MTJ cell elements 260, 265 the state parameter values can include different sets of resistance values. For example, the first MTJ cell element 260 can have a first low resistance value $R_1p$ and a first high resistance value $R_1ap$, and the second MTJ cell element 265 can have a second low resistance value $R_2p$ and a second high resistance value $R_2ap$, wherein the four resistance values $R_1p$, $R_1ap$, $R_2p$, $R_2ap$ are all different from one another. In such case four levels of resistance can be achieved by combining each state of two MTJ cell elements. Each of the MTJ cell elements can have two states, two different threshold currents (Isw) and two different resistance variations (ΔR). The four resistance states can be uniquely defined by the combination of the relative magnetization of the two MTJ cell elements. As illustrated in Table 1, MBC 205 including two MTJ cell elements 260, 265 can therefore exhibit four resistance values R1, R2, R3 and R4. In aspects, the difference in the two states, the two different threshold currents and the two difference resistance variations can be obtained by either varying the thermal stability factor of each MTJ cell element 260, 265, by varying a damping parameter of each MTJ cell element's free layer, or by varying the tunnel barrier properties of each MTJ cell element. For example, the thermal stability factor of each MTJ cell element can be varied by variations in the interfacial anisotropy, element size, saturation magnetization, and/or the like.

Figure 12A:
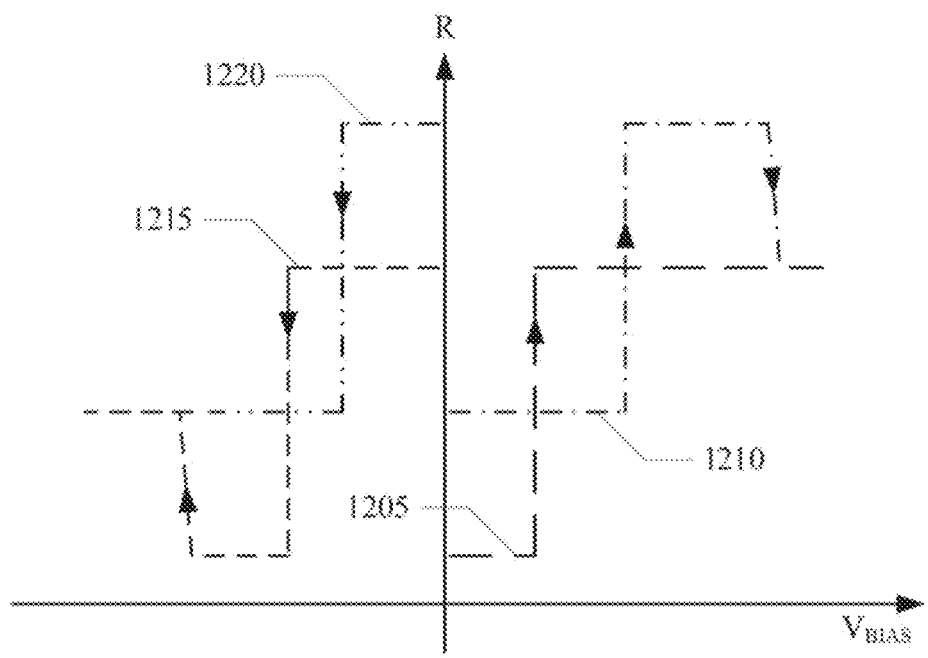
FIGS. 12A-12D show a diagram illustrating state parameter values and transitions therebetween of a MBC, in accordance with aspects of the present technology.
Figure 12B:
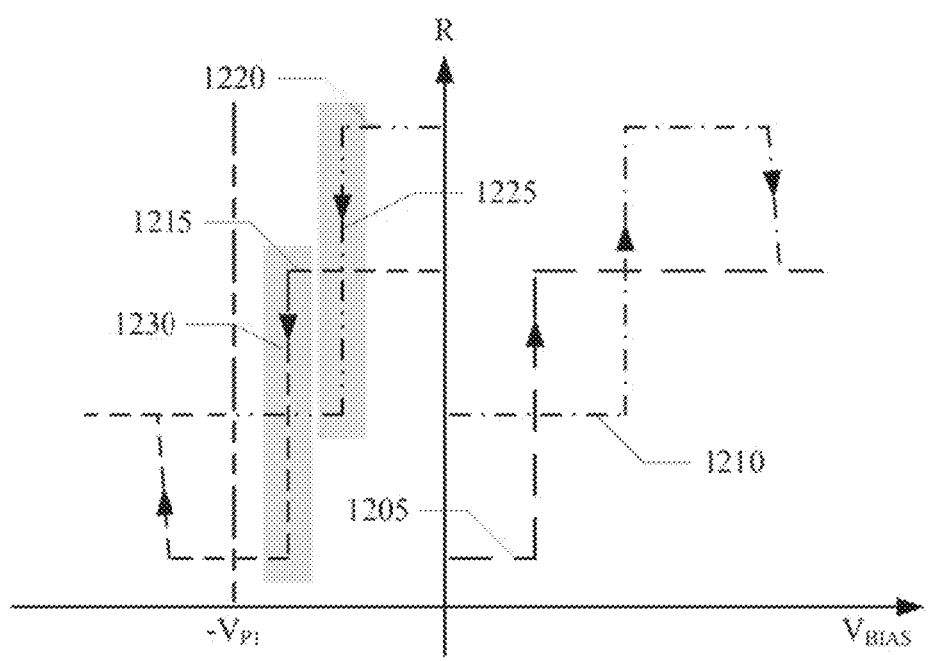
Figure 12C:
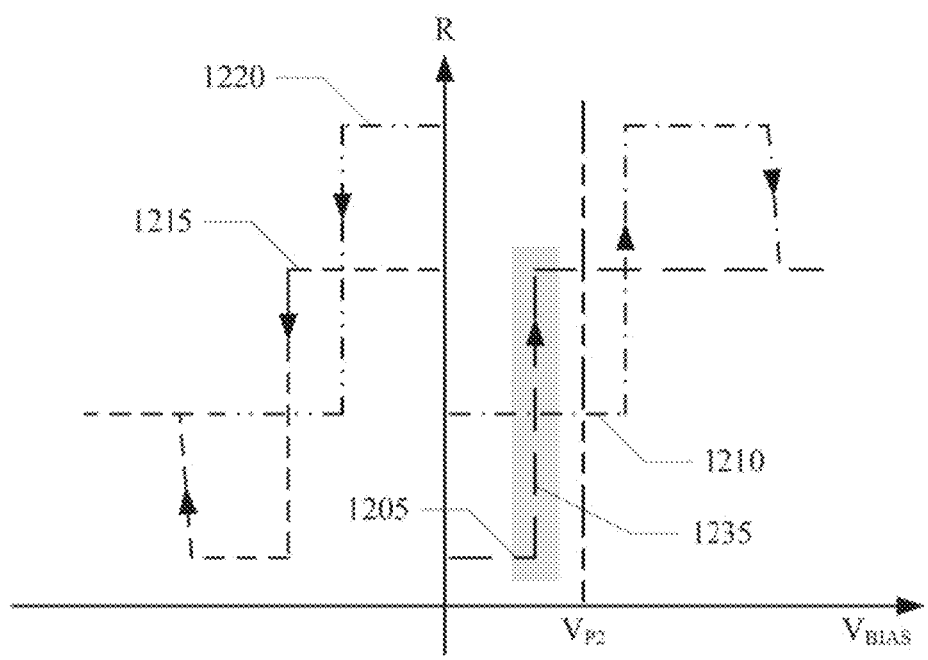

Referring now to FIGS. 12A-12D, a diagram illustrating state parameter values and transitions therebetween of a MBC, in accordance with aspects of the present technology, is shown. The cell elements of the MBC can have opposite pinned magnetization polarization orientations. For example, the MBC can include a first cell element having a magnetization polarization orientation of the one or more fixed magnetic layers in a first direction, and a second cell element having a magnetization polarization orientation of the one or more fixed magnetic layers in a second direction. The cell elements of the MBC can also have different sets of state parameter values, and therefore the MBC can have unique state parameters and unique transitions therebetween. For example, if the MBC includes a first cell element having resistance states $R_1p$ and $R_1ap$ and a second cell element having resistance states $R_2p$ and $R_2ap$, the MBC can have four unique resistance values $R_1$ 1205, $R_2$ 1210, $R_3$ 1215 and $R_4$ 1220. In addition, the transitions between the resistance states can also be unique. For example, a first set of programming voltages $(-V_{P1})$ can change the state of the first cell element from the $R_1ap$ state to the $R_1p$ state, but not change the state of the second cell element. If the second cell element is in the $R_2ap$ state, the MBC can transition 1225 from the $R_4$ state 1220 to the $R_2$ state 1210. However, if the second cell element is in the $R_2p$ state, the MBC can transition 1230 from the $R_3$ 1215 state to the $R_1$ state 1205, as illustrated in FIG. 12B. Similarly, a second set of programming voltages $(V_{P2})$ can change the state of the first cell element from the $R_1p$ state back to the $R_1ap$ state, but not change the state of the second cell element. If the second cell element is in the $R_2p$ state, the MBC can transition 1235 from the $R_1$ 1205 state to the $R_3$ state 1215, as illustrated in FIG. 12C. However, if the second cell is in the $R_2ap$ state, the MBC cannot transition from the $R_2$ state 1210 to the $R_4$ state 1220 in response to the second set of programming voltages $(V_{P2})$.

Based on the successive sets of state programming conditions applied to flip a given cell and the detection of transitions between state parameters, it is possible to determine the read state of the MBC 205. For example, if a state transition 1225, 1230 is detected in response to a negative programming voltage $(-V_{P1})$ and another state transition 1235 is detected in response to a positive programming voltages $(V_{P2})$, then the MBC read state was originally in the third resistance state $R_3$ 1215. If a state transition 1225, 1230 is detected in response to the negative programming voltage $(-V_{P1})$, but another state transition is not detected in response to the positive programming voltage $(V_{P2})$, then the MBC read state was originally in the fourth resistance state $R_4$ 1220. If a state transition is not detected in response to the negative programming voltage $(-V_{P1})$, but a state transition 1235 is detected in response to the positive programming voltage $(V_{P2})$, then the MBC read state was originally in the first resistance state $R_1$ 1205. If no state transition is detected in response to both the negative and the positive programming voltages $(-V_{P1}, V_{P2})$, then the MBC read state was originally in the second resistance state $R_2$ 1210.

In an exemplary implementation, a first MJT cell 260 can have a smaller diameter of approximately 40 nm and the second MTJ cell 265 can have a larger diameter of approximately 60 nm. A first programming voltage $(-V_{P1})$ of approximately −0.5 Volts (V) can be applied for a duration of approximately 100 nano-seconds (ns). If the first MTJ cell 265 is in an antiparallel state (e.g., fourth or third resistance state 1220, 1215), the first programming voltage ($-V_{P1}$) can cause the first MTJ cell 260 to transition 1225, 1230 to a parallel state (e.g., second or first resistance state 1210, 1205), as illustrated in FIG. 12B. However, the first programming voltage ($-V_{P1}$) is selected so that the second MTJ cell 265 will not change states. A second programming voltage ($V_{P2}$) of approximately 0.3 V for a duration of approximately 100 ns can then be applied. The second programming voltage ($V_{P2}$) can cause the first MTJ cell 260 to transition 1235 from the parallel state (e.g., first resistance state 1205) to the antiparallel state (e.g., third resistance state 1215). However, the second programming voltage ($V_{P2}$) is selected so that the state of the second MTJ cell 265 will not change states. Accordingly, the first and second programming voltages ($-V_{P1}$, $V_{P2}$) can be configured to flip the state of the first MTJ cell 260 at least one time without flipping the state of the second MTJ cell 265. Based on whether the state of the first MTJ cell 260 flipped in response to the first programming voltage ($-V_{P1}$), the second programming voltage ($V_{P2}$) or both, the state of both the first and second MTJ cells 260, 265 can be determined.

Figure 12D:
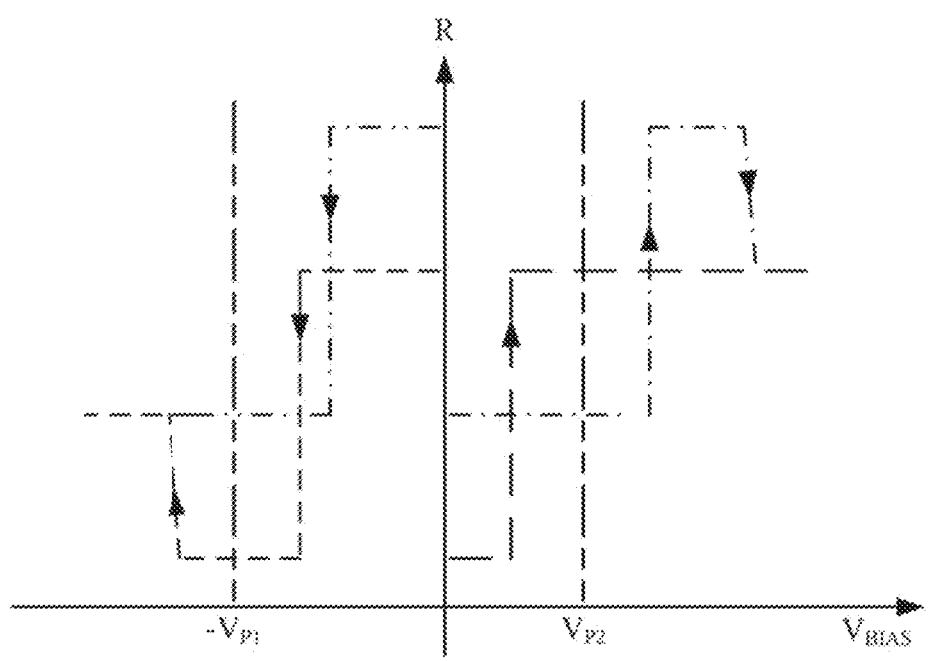

In aspects, the margins between the resistive state transitions 1225-1235 can be asymmetric. In an MTJ based MBC implementation, the margins between the resistive state transitions can be adjusted by adjusting the fringe fields between the magnetic layers of the individual MTJs of the MBC, as illustrated in FIG. 12D. In aspects, if a given margin between the resistive state transitions 1225-1235 is relatively wide, a relatively short programming current pulse can be applied to the MBC. However, if the given margin between the resistive state transitions 1225-1235 is relatively narrow, a relatively longer programming current pulse can be applied to the MBC.

Figure 13:
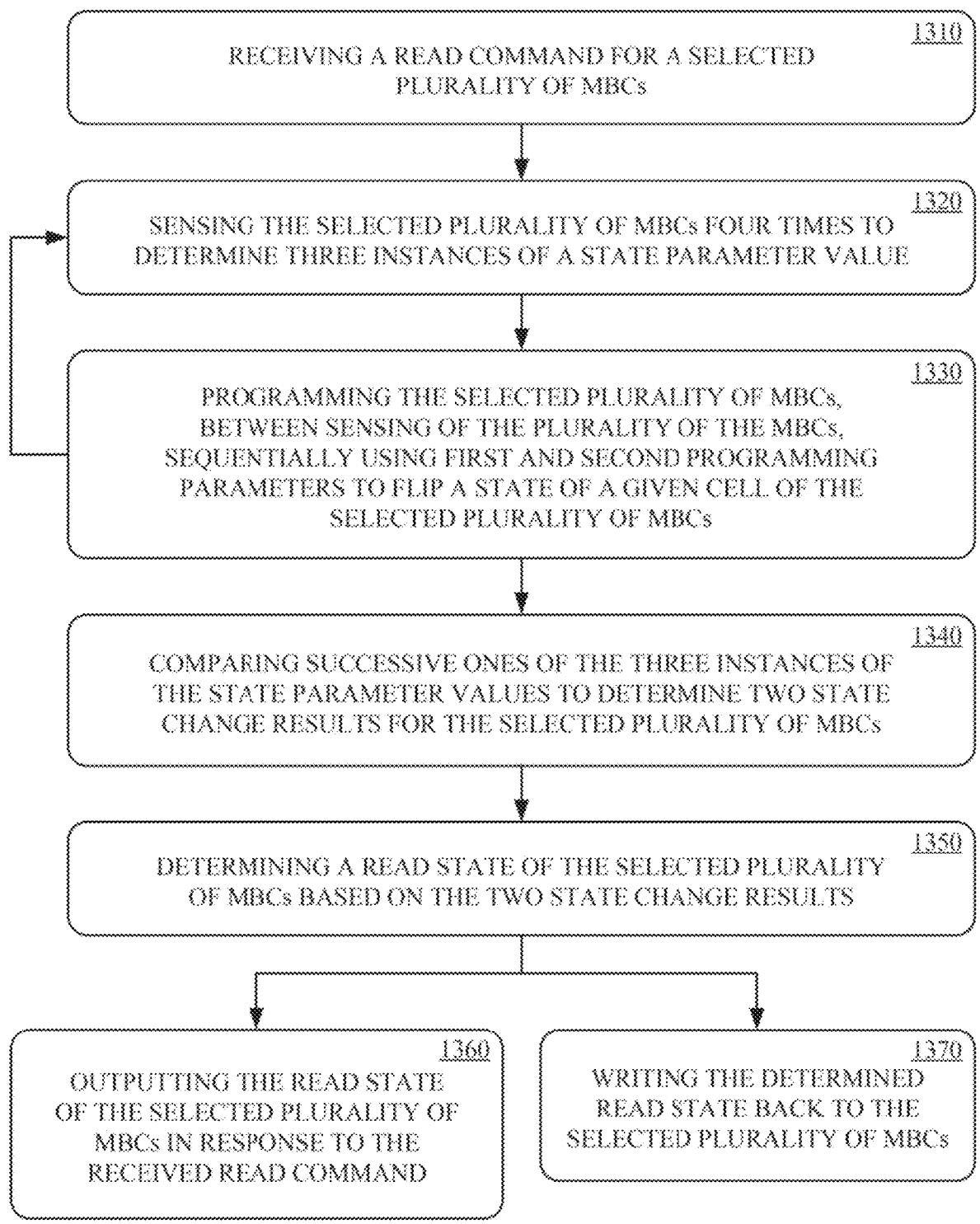
FIG. 13 shows a method of reading a MBC memory device, in accordance with aspects of the present technology.

Referring now to FIG. 13, a method of reading a Multi-Bit Cell (MBC) memory device, in accordance with aspects of the present technology, is shown. The memory device can include an array of MBCs and one or more memory circuits. The MBCs can include two cell elements coupled in series. The cell elements can have two different states, such that the MBCs have four states.

In aspects, the memory device can receive a read command for a selected plurality of MBCs, at 1310. The read command can be received from a processing unit, such as a central processing unit (CPU), a graphics processing unit (GPU), digital signal processor (DSP), micro-controller or the like. The selected plurality of MBCs can be a computing device readable byte, word, page, code word, of the like portion of the MBC array.

In aspects, the memory device can sense the selected plurality of MBCs four times to determine three instances of a state parameter value, at 1320. The memory device can program the selected plurality of MBCs, between sensing of the selected plurality of the MBCs, sequentially using a first set of programming parameters and then a second set of programming parameters to flip a state of a given cell of the selected plurality of MBCs, at 1330. In one implementation, a first one of the sets of programming parameters can be selected to program a first one of the plurality of cell elements to a known state. A second one of the sets of programming parameters can be selected to switch the first one of the cell elements from the known state to the other state. In an exemplary implementation, the first set of programming parameters can include a voltage pulse of approximately -0.5 Volts (V) with a pulse length of approximately 100 nano-seconds (ns) and the second set of programming parameters can include a voltage pulse of approximate 0.3 V and a pulse length of approximately 100 ns.

The memory device can compare successive ones of the three instances of the state parameter value to determine two state change results for the selected plurality of MBCs, at 1340. In one instance, the first instance of the sense voltage can be compared with the second instance of the sense voltage to determine the presence or absence of a change in the sense voltage in response to the first set of programming parameters, and the second instance of the sense voltage can be compared with a third instance to determine the presence or absence of a change in the sense voltage in response to the second set of programming parameters. The memory device can determine a read state of the selected plurality of MBCs based on the two state change results, at 1350. The read state of the selected plurality of MBCs can be determined from the unique combination of the results of the two state change determinations. In an exemplary implementation, a lookup table, as illustrated in Table 4, can be accessed to map the state change determination results to a given read state of the MBC.

TABLE 4

| State Change in Response to 1$^{st}$ Set of Programming Parameters | State Change in Response to 2$^{nd}$ Set of Programming Parameters | Read State of MBC (265/260) |
| --- | --- | --- |
| Y | N | 11 |
| Y | Y | 10 |
| N | N | 01 |
| N | Y | 00 |

The memory device can output the read state of the selected plurality MBCs in response to the received read command, at 1360. The memory device can also write the determined read state back to the selected plurality of MBCs, at 1370. The read operation is a destructive read as a result of the successive programming of the selected plurality of MBCs at 1330. Therefore, the determined read state can be written back to the selected plurality of MBCs to restore the state of the MBCs to their original state prior to the read operation.

In one example, if a transition was not detected in response to both the first and second programming voltages ($-V_{P1}$, $V_{P2}$), neither the state of the first MTJ cell 260 nor the second MTJ cell 265 was disturbed and a write is not needed to return to the original state of the MBC. Similarly, if a transition was detected in response to both the first and second programming voltages ($-V_{P1}$, $V_{P2}$), the state of the first MTJ cell 260 was reset and then set and a write is not needed to return the original state of the MBC. If a transition was not detected in response to the first programming voltage ($-V_{P1}$) but was detected in response to the second programming voltage ($V_{P2}$), the first and second MTJ cells 260, 265 can be programmed to the low state (e.g., parallel states). If a transition was detected in response to the first programming voltage ($-V_{P1}$) but was not detected in response to the second programming voltage ($V_{P2}$), the first and second MTJ cells 260, 265 can be programmed to the high state (e.g., parallel states).

Figure 14A:
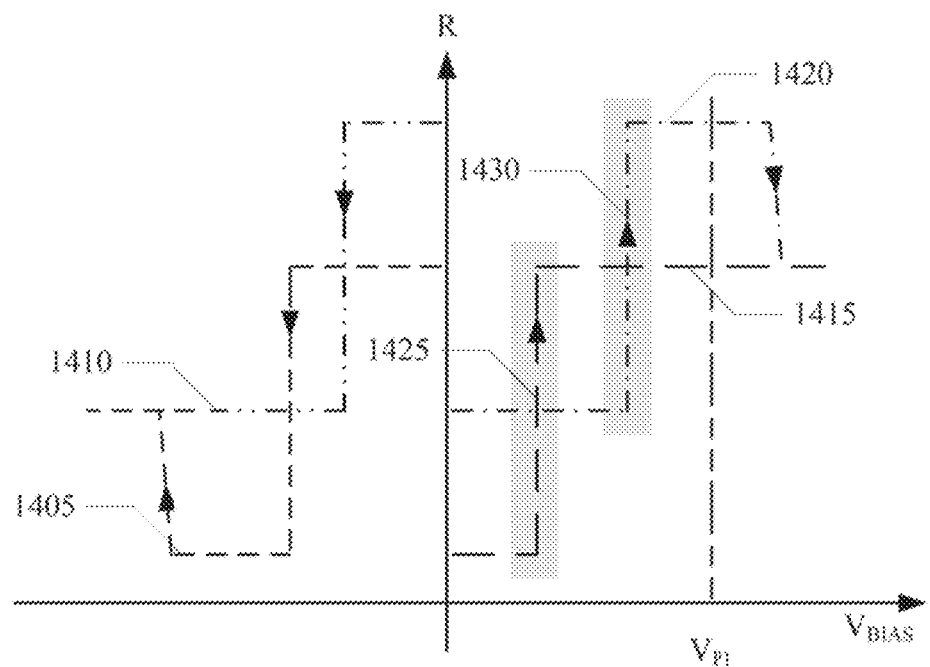
FIGS. 14A and 14B show a diagram illustrating state parameter values and transitions therebetween of a MBC, in accordance with aspects of the present technology.
Figure 14B:
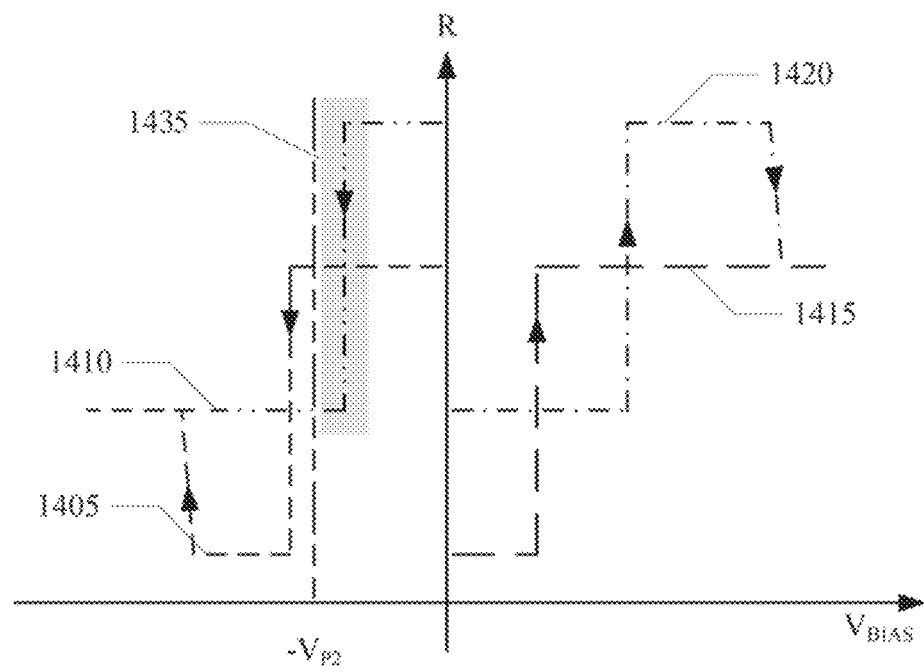

The techniques of flipping a given bit of an MBC, wherein the MTJ cells have opposite pinned magnetization polarizations works with applying one negative and then applying one positive programming voltage pulse (as described with reference to FIGS. 12A-12D, or with applying one positive programming voltage pulse and then one negative programming voltage pulse. Referring now to FIGS. 14A and 14B a diagram illustrating state parameter values and transitions therebetween of a MBC, in accordance with aspects of the present technology, is shown. The cell elements of the MBC can have opposite pinned magnetization polarization orientations. The cell elements of the MBC can also have different sets of state parameter values, and therefore the MBC can have unique state parameters and unique transitions therebetween. The bit-flipping technique of applying one positive programming voltage pulse and then one negative programming voltage pulse illustrated in FIGS. 14A and 14B will be further explained with reference to FIG. 13.

At 1320, a selected plurality of MBCs can be sensed a first time to determine a first resistance value (present state). At 1330, a positive programming voltage ($V_{P1}$) can be applied to the selected plurality of MBCs. In one implementation, a first programming voltage of approximately 0.4 V can be applied to program the first MTJ cell of each of the plurality of MBCs to an antiparallel state 1415, 1420. At 1320, the selected plurality of MBCs can be sensed a second time to determine a second resistance value (first new state). At 1330, a negative programming voltage ($-V_{P2}$) can be applied to the selected plurality of MBCs. In one implementation, second programming voltage of approximately −0.3 V can be applied to program the first MTJ cell in each of the plurality of MBCs to a parallel state 1410. At 1320, the selected plurality of MBCs can be sensed a third time to determine a third resistance value (second new state). At 1340, the first and second sensed resistance values can be compared to determine if a first change occurred in response to the positive programming voltage ($V_{P1}$). If the first and second sensed resistance values are the same, a state change transition did not occur. If the first and second sensed resistance values are different, a state change transition 1425, 1430 occurred. The second and third sensed resistance values can also be compared to determine if a second change occurred in response to the negative programming voltage ($-V_{P2}$). If the second and third sensed resistance values are different, a state change transition 1435 occurred. If the second and third sensed resistance values are the same, a state change transition did not occur. At 1350, a read state of the selected plurality of MBCs can be determined based on the determined state change results.

In accordance with aspects of the present technology, the techniques of flipping a given bit of an MBC, wherein the MTJ cells have opposite pinned magnetization polarizations, advantageously employs a self-reference scheme. The comparison does not utilize a reference resistance and therefore is not impacted by an overlap in the resistance distribution of nearby resistance states. The bit-flipping technique utilized with MTJ cells having opposite pinned magnetization polarizations can advantageously utilize smaller-amplitude voltage pulses as compared to the sequential switching technique utilized with MTJ cells having opposite pinned magnetization polarizations. Smaller-amplitude voltage pulses can be utilized because the technique does not attempt to switch the larger harder-to switch MTJ cell. The use of smaller-amplitude voltage pulses can advantageously improve device endurance. The bit-flipping technique utilized with MTJ cells also advantageously needs no more than one additional step to write the state back to the MBC. The need for one additional step to write back just two of the four states advantageously improves the speed of the read technique and the endurance of the device.

Figure 15A:
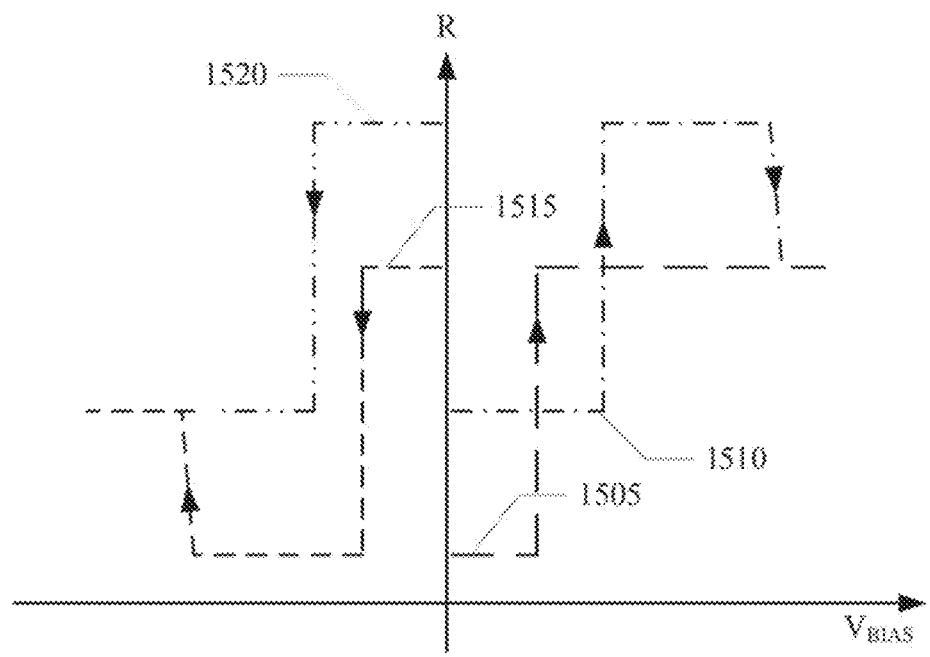
FIGS. 15A-15D show a diagram illustrating state parameter values and transitions therebetween of a MBC, in accordance with aspects of the present technology.
Figure 15B:
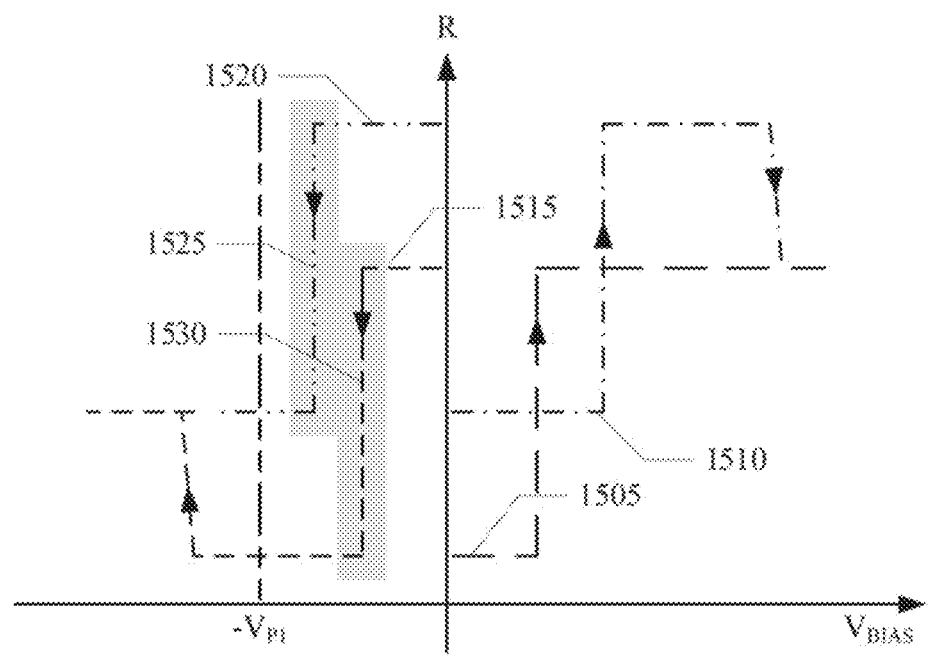
Figure 15C:
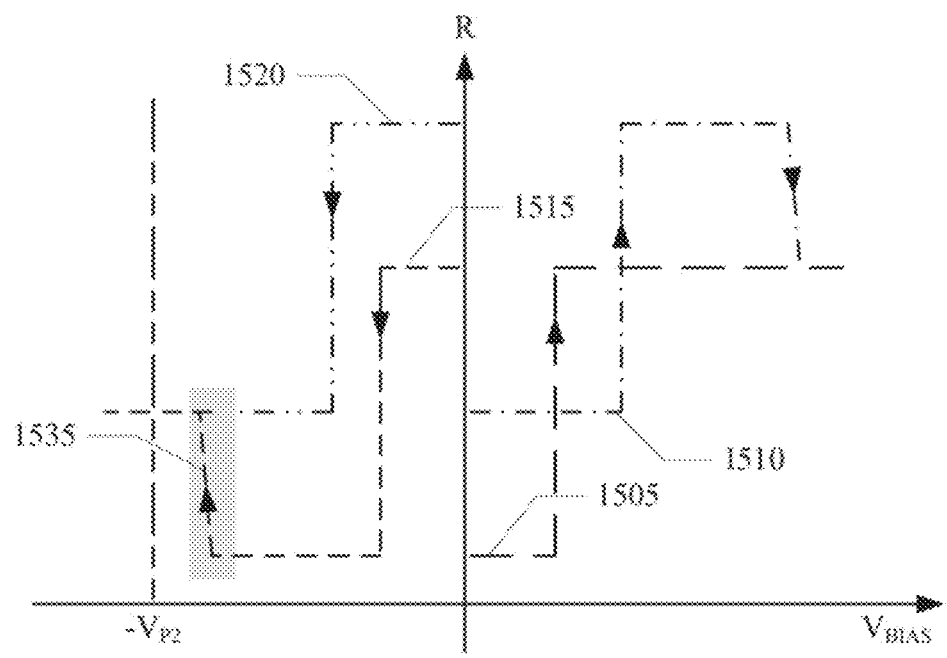

Referring now to FIGS. 15A-15C, a diagram illustrating state parameter values and transitions therebetween of a MBC, in accordance with aspects of the present technology, is shown. The cell elements of the MBC can have opposite pinned magnetization polarization orientations as illustrated in FIG. 11A. For example, the MBC can include a first cell element having a magnetization polarization orientation of the one or more fixed magnetic layers in a first direction, and a second cell element having a magnetization polarization orientation of the one or more fixed magnetic layers in a second direction. The cell elements of the MBC can also have different sets of state parameter values, and therefore the MBC can have unique state parameters and unique transitions therebetween. For example, if the MBC includes a first cell element having resistance states $R_1$ap and $R_1$p and a second cell element having resistance states $R_2$ap and $R_2$p, the MBC can have four unique resistance values $R_1$ 1505, $R_2$ 1510, $R_3$ 1515 and $R_4$ 1520. In addition, the transitions between the resistance states can also be unique. For example, a first set of programming voltages ($-V_{P1}$) can change the state of the first cell element from the $R_1$ap state to the $R_1$p state, but not change the state of the second cell element. If the second cell element is in the $R_2$ap state, the MBC can transition 1525 from the $R_4$ 1520 state to the $R_2$ state 1510. However, if the second cell element is in the $R_2$p state, the MBC can transition 1530 from the $R_3$ 1520 state to the $R_1$ state 1505, as illustrated in FIG. 15B. Similarly, a second set of programming voltages ($-V_2$) can change the state of the first cell element from the $R_1$p state to the $R_1$ap state, but not change the state of the second cell element. If the second cell element is in the $R_2$p state, the MBC can transition 1535 from the $R_1$ 1505 state to the $R_2$ state 1510, as illustrated in FIG. 15C.

Based on the successive sets of state programming conditions applied and the detection of transitions between state parameters, it is possible to determine the read state of the MBC 205. For example, if a state transition 1525, 1530 is detected in response to a first negative programming voltage ($-V_{P1}$) and another state transition 1535 is detected in response to a second negative programming voltage ($-V_{P2}$), then the MBC read state was originally in the third resistance state $R_3$ 1515. If a state transition 1525, 1530 is detected in response to the first negative programming voltage ($-V_{P1}$), but another state transition is not detected in response to the second negative programming voltage ($-V_{P2}$), then the MBC read state was originally in the fourth resistance state $R_4$ 1520. If a state transition is not detected in response to the first negative programming voltage ($-V_{P1}$), but a state transition 1535 is detected in response to the second negative programming voltage ($-V_{P2}$), then the MBC read state was originally in the first resistance state $R_1$ 1505. If no state transition is detected in response to both the first and second negative programming voltages ($-V_{P1}$, $-V_{P2}$), then the MBC read state was originally in the second resistance state $R_2$ 1510.

In an exemplary implementation, a first MTJ cell 260 can have a smaller diameter of approximately 40 nm and the second MTJ cell 265 can have a larger diameter of approximately 60 nm. A first programming voltage ($-V_{P1}$) of approximately −0.5 V can be applied for a duration of approximately 100 ns. If the first MTJ cell 265 is in an antiparallel state (e.g., fourth or third resistance state 1520, 1515), the first programming voltage ($-V_{P1}$) can cause the first MTJ cell 260 to transition 1525, 1530 to a parallel state (e.g., second or first resistance state 1510, 1505), as illustrated in FIG. 15B. However, the first programming voltage ($-V_{P1}$) is selected so that the state of the second MTJ cell 265 will not change states. A second programming voltage ($-V_{P2}$) of approximately −0.9 V can then be applied for a duration of approximately 100 ns. The second programming voltage ($-V_{P2}$) can cause the second MTJ cell 260 to transition 1235 from the parallel state (e.g., first resistance state 1505) to the antiparallel state (e.g., second resistance state 1515).

Figure 15D:
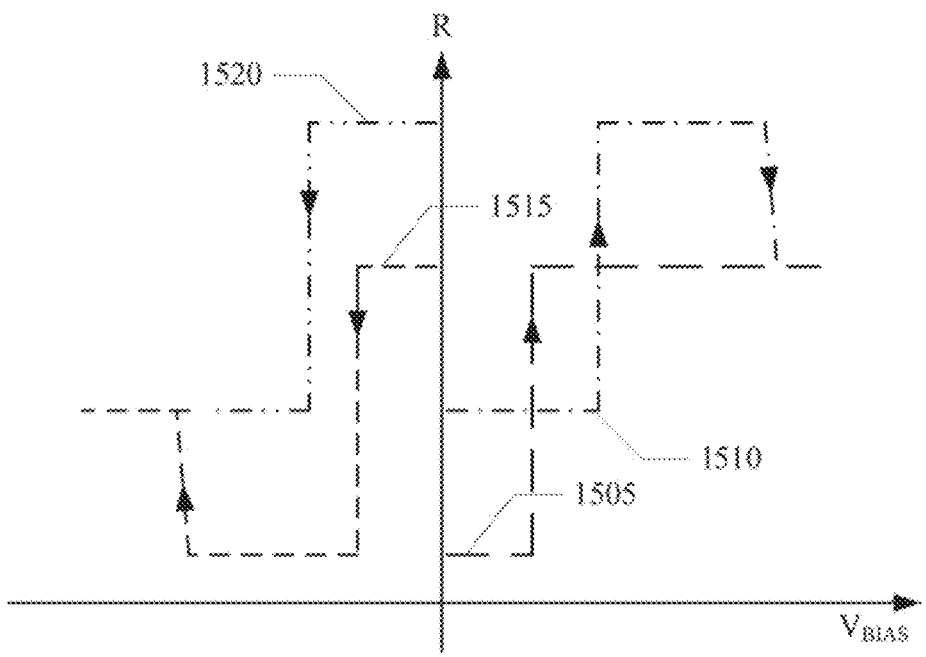

In aspects, the margins between the resistive state transitions 1525-1535 can be asymmetric. In an MTJ based MBC implementation, the margins between the resistive state transitions can be adjusted by adjusting the fringe fields between the magnetic layers of the individual MTJs of the MBC, as illustrated in FIG. 15D. In aspects, if a given margin between the resistive state transitions 1525-1535 is relatively wide, a relatively short programming current pulse can be applied to the MBC. However, if the given margin between the resistive state transitions 1525-1535 is relatively narrow, a relatively longer programming current pulse can be applied to the MBC.

Figure 16:
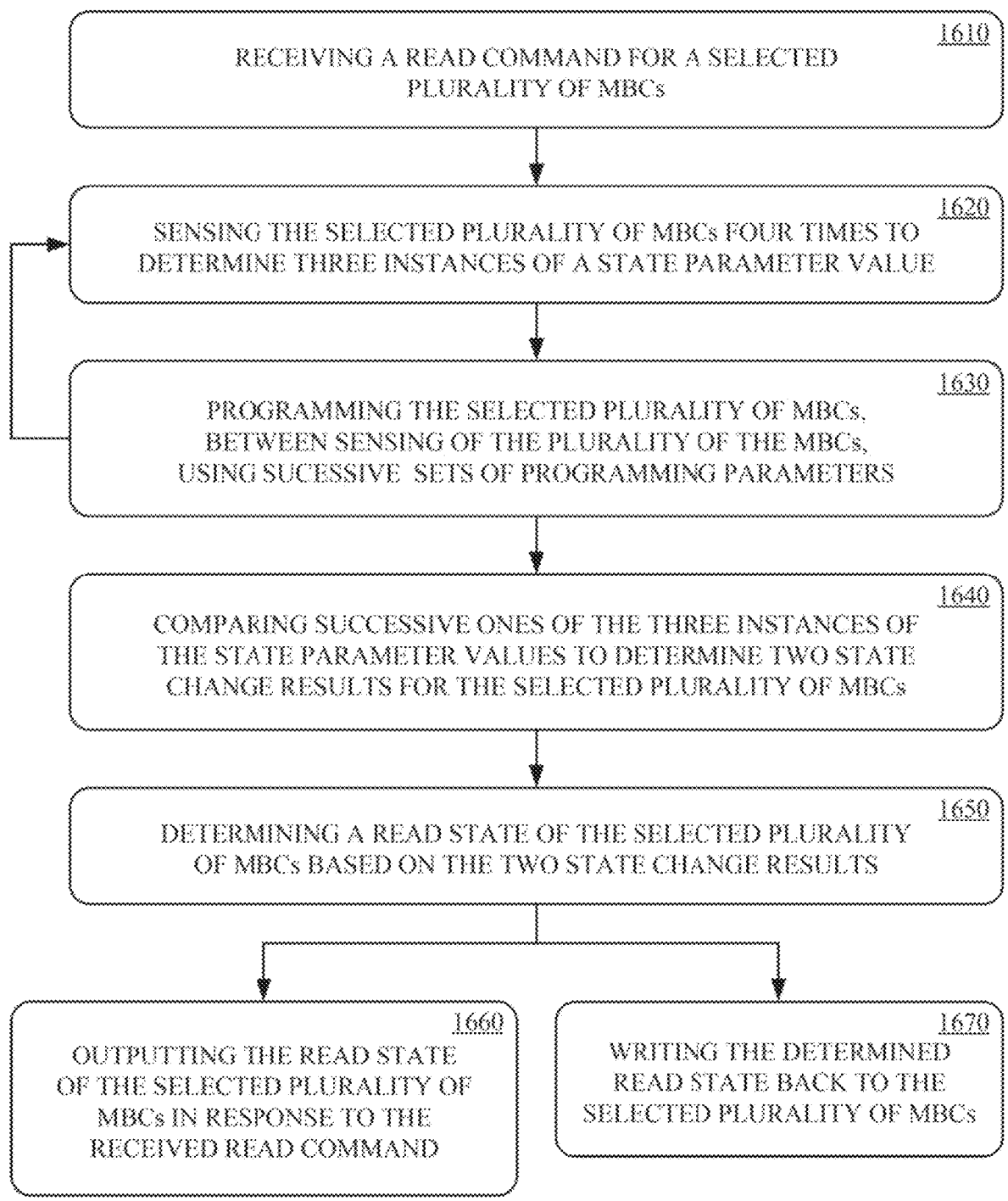
FIG. 16 shows a method of reading a MBC memory device, in accordance with aspects of the present technology.

Referring now to FIG. 16, a method of reading a Multi-Bit Cell (MBC) memory device, in accordance with aspects of the present technology, is shown. The memory device can include an array of MBCs and one or more memory circuits. The MBCs can include two cell elements coupled in series. The cell elements can have two different states, such that the MBCs have four states.

In aspects, the memory device can receive a read command for a selected plurality of MBCs, at 1610. The read command can be received from a processing unit, such as a central processing unit (CPU), a graphics processing unit (GPU), digital signal processor (DSP), micro-controller or the like. The selected plurality of MBCs can be a computing device readable byte, word, page, code word, of the like portion of the MBC array.

In aspects, the memory device can sense the selected plurality of MBCs four times to determine three instances of a state parameter value, at 1620. The memory device can program the selected plurality of MBCs, between sensing of the selected plurality of the MBCs, sequentially using a first set of programming parameters and then a second set of programming parameters, at 1630. In one implementation, a first one of the sets of programming parameters can be selected to switch a first one of the plurality of cell elements from one state to the other state of the first cell element. A second one of the sets of programming parameters can be selected to switch a second one of the cell elements from one state to the other state of the second cell element. In an exemplary implementation, the first set of programming parameters can include a voltage pulse of approximately −0.5 Volts (V) with a pulse length of approximately 100 nano-seconds (ns), and the second set of programming parameters can include a voltage pulse of approximate −0.9 V and a pulse length of approximately 100 ns.

The memory device can compare successive ones of the three instances of the state parameter value to determine two state change results for the selected plurality of MBCs, at 1640. In one instance, the first instance of the sense voltage can be compared with the second instance of the sense voltage to determine the presence or absence of a change in the sense voltage in response to the first set of programming parameters, and the second instance of the sense voltage can be compared with a third instance to determine the presence or absence of a change in the sense voltage in response to the second set of programming parameters. The memory device can determine a read state of the selected plurality of MBCs based on the two state change results, at 1650. The read state of the selected plurality of MBCs can be determined from the unique combination of the results of the two state change determinations. In an exemplary implementation, a lookup table, as illustrated in Table 5, can be accessed to map the state change determination results to a given read state of the MBC.

TABLE 5

| State Change in Response to 1$^{st}$ Set of Programming Parameters | State Change in Response to 2$^{nd}$ Set of Programming Parameters | Read State of MBC (265/260) |
|---|---|---|
| Y | N | 11 |
| Y | Y | 10 |
| N | N | 01 |
| N | Y | 00 |

The memory device can output the read state of the selected plurality MBCs in response to the received read command, at 1660. The memory device can also write the determined read state back to the selected plurality of MBCs, at 1670. The read operation is a destructive read as a result of the successive programming of the selected plurality of MBCs at 1630. Therefore, the determined read state can be written back to the selected plurality of MBCs to restore the state of the MBCs to their original state prior to the read operation.

In one example, if a transition was not detected in response to both the first and second programming voltages ($-V_{P1}$, $-V_{P2}$), neither the state of the first MTJ cell 260 nor the second MTJ cell 265 was disturbed and a write is not needed to return to the original state of the MBC. If a transition was not detected in response to the first programming voltage ($-V_{P1}$) but was detected in response to the second programming voltage ($-V_{P2}$), the first MTJ cell 260 will be in a high state and the second MTJ cell 265 will be in a low state, and will need to be programmed to a low/high state respectively and then to the original low/low state. the first and second MTJ cells 260, 265 can be programmed to the low state (e.g., parallel states). If a transition was detected in response to the first programming voltage ($-V_{P1}$) but was not detected in response to the second programming voltage ($-V_{P2}$), the first and second MTJ cells 260, 265 can be programmed to the high state (e.g., parallel states). If a transition was detected in response to both the first and second programming voltages ($-V_{P1}$, $V_{P2}$), the state of the first and second MTJ cells 260, 265 can be programmed to a low/high state respectively.

Figure 17A:
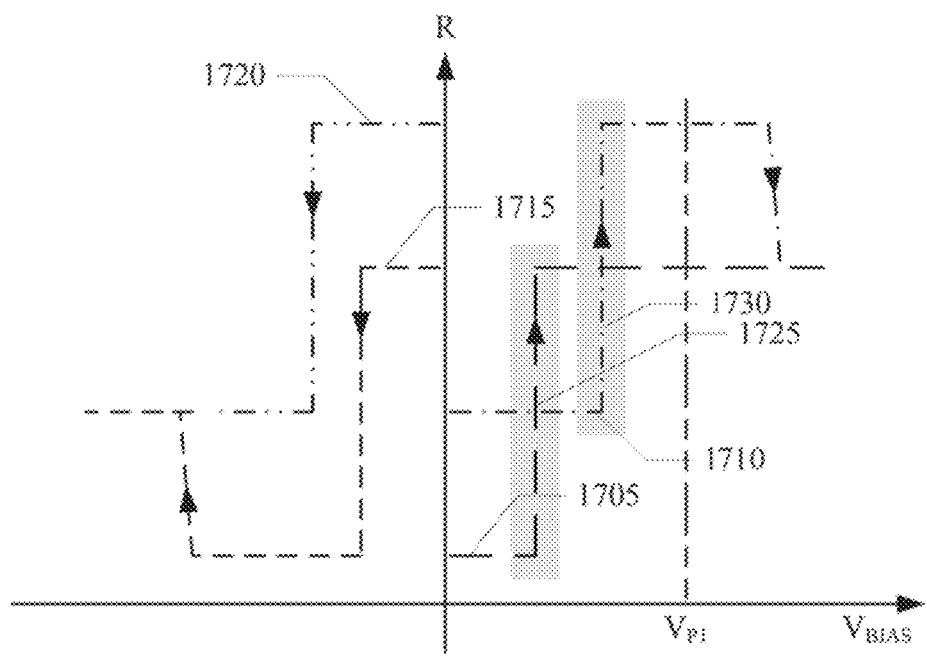
FIGS. 17A and 17B show a diagram illustrating state parameter values and transitions therebetween of a MBC, in accordance with aspects of the present technology.
Figure 17B:
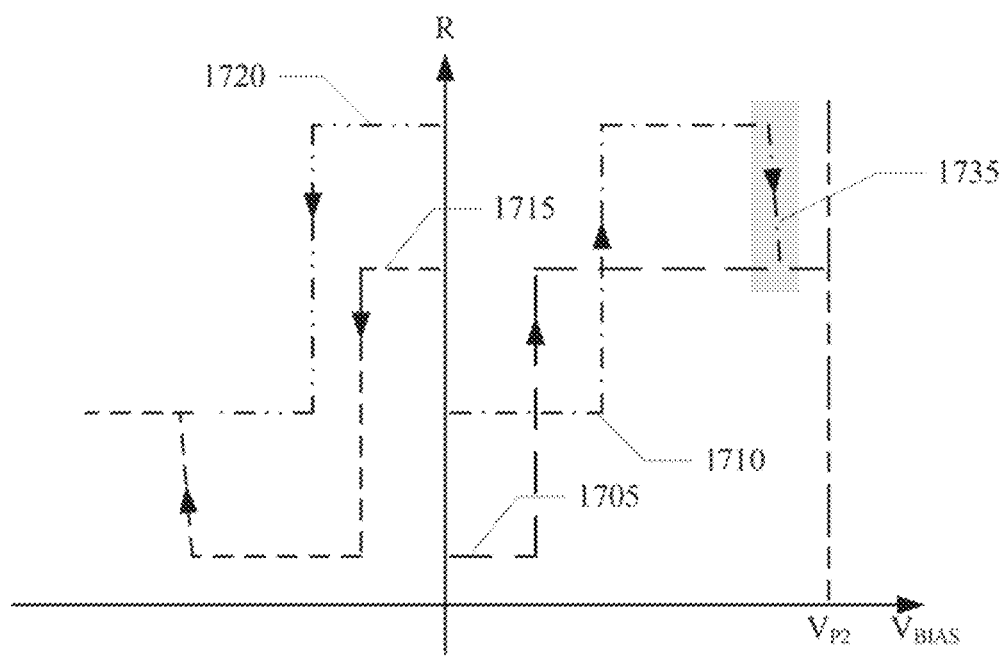

The techniques of sequentially programming the bits of the MBC, wherein the MTJ cells have opposite pinned magnetization polarizations works with sequentially applying two negative programming voltage pulses (as described with reference to FIGS. 15A-15D), or with successively applying two positive programming voltage pulses. Referring now to FIGS. 17A and 17B a diagram illustrating state parameter values and transitions therebetween of a MBC, in accordance with aspects of the present technology, is shown. The cell elements of the MBC can have opposite pinned magnetization polarization orientations. The cell elements of the MBC can also have different sets of state parameter values, and therefore the MBC can have unique state parameters and unique transitions therebetween. The technique of successively applying two positive programming voltage pulses illustrated in FIGS. 17A and 17B will be further explained with reference to FIG. 16.

At 1320, a selected plurality of MBCs can be sensed a first time to determine a first resistance value (present state). At 1330, a first positive programming voltage ($V_{P1}$) can be applied to the selected plurality of MBCs. In one implementation, a first programming voltage 1405 of approximately 0.5 V can be applied to program the first MTJ cell of each of the plurality of MBCs to an antiparallel state 1715, 1720. At 1320, the selected plurality of MBCs can be sensed a second time to determine a second resistance value (first new state). At 1330, a second positive programming voltage ($V_{P2}$) can be applied to the selected plurality of MBCs. In one implementation, a second programming voltage of approximately 0.9 V can be applied to program the second MTJ cell in each of the plurality of MBCs to an antiparallel state 1720. At 1320, the selected plurality of MBCs can be sensed a third time to determine a third resistance value (second new state). At 1340, the first and second sensed resistance values can be compared to determine if a first change occurred in response to the first positive programming voltage ($V_{P1}$). If the first and second sensed resistance values are the same, a state change transition did not occur. If the first and second sensed resistance values are different, a state change transition 1725, 1730 occurred. The second and third sensed resistance values can also be compared to determine if a second change occurred in response to the second positive programming voltage $V_2$. If the second and third sensed resistance values are different, a state change transition 1735 occurred. If the second and third sensed resistance values are the same, a state change transition did not occur. At 1350, a read state of the selected plurality of MBCs can be determined based on the determined state change results.

Figure 18:
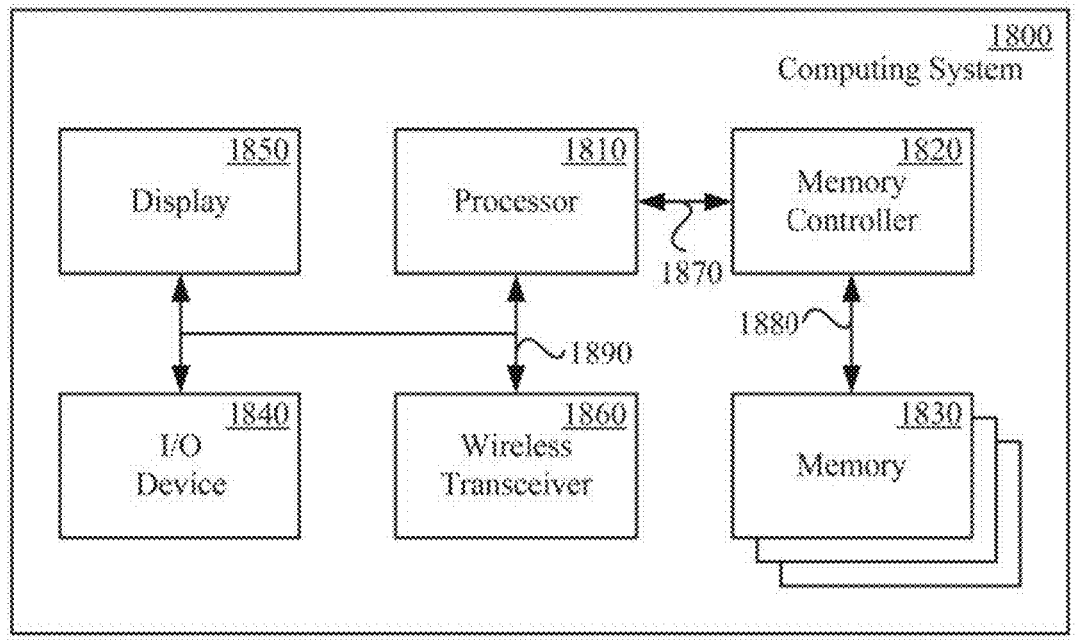
FIG. 18 shows a block diagram of a computing system including a memory device, in accordance with aspects of the present technology.

Referring now to FIG. 18, a block diagram of a computing system including a memory device, in accordance with aspects of the present technology, is shown. The computing system 1800 can, for example, be a cellular telephone, smart phone, e-reader, table personal computer (PC), laptop PC, desktop PC, gaming console, workstation, server computer, or other similar computing device. The computing system 1800 can include one or more processors 1810, one or more memory controllers 1820, one or more memory devices 1830, and one or more input/output devices 1840. The one or more input/output device 1840 can include, for example, a display 1850, a wireless transceiver 1860 and the like. The computing system 1800 can also include other sub-circuits that are not necessary for an understanding of the present technology and therefore are not discussed herein.

The one or more memory controllers 1820 can be operable to control access to data stored in the one or more memory devices 1830 for use by the one or more processors 1810, one or more input/output devices 1840 and/or other sub-systems of the computing system 1800 communicatively coupled together by one or more buses 1870-1890. The one or more memory controllers 1820 can generate commands for reading and writing of data in the one or more memory devices 1830 in response to memory requests received from the one or more processors 1810, one or more input/output devices 1840 and/or other sub-systems. One or more of the memory devices 1830 can include the MBC array as described herein. In one implementation, the one or more memory devices 1830 can be a MBC Magnetoresistive Random Access Memory (MRAM), MBC cross-point MRAM, MBC Spin Transfer Torque Magnetoresistive Random Access Memory (STT-MRAM), MBC cross-point STT-MRAM, MBC Phase Change Memory (PCM), MBC cross-point PCM, or the like.

Figure 19:
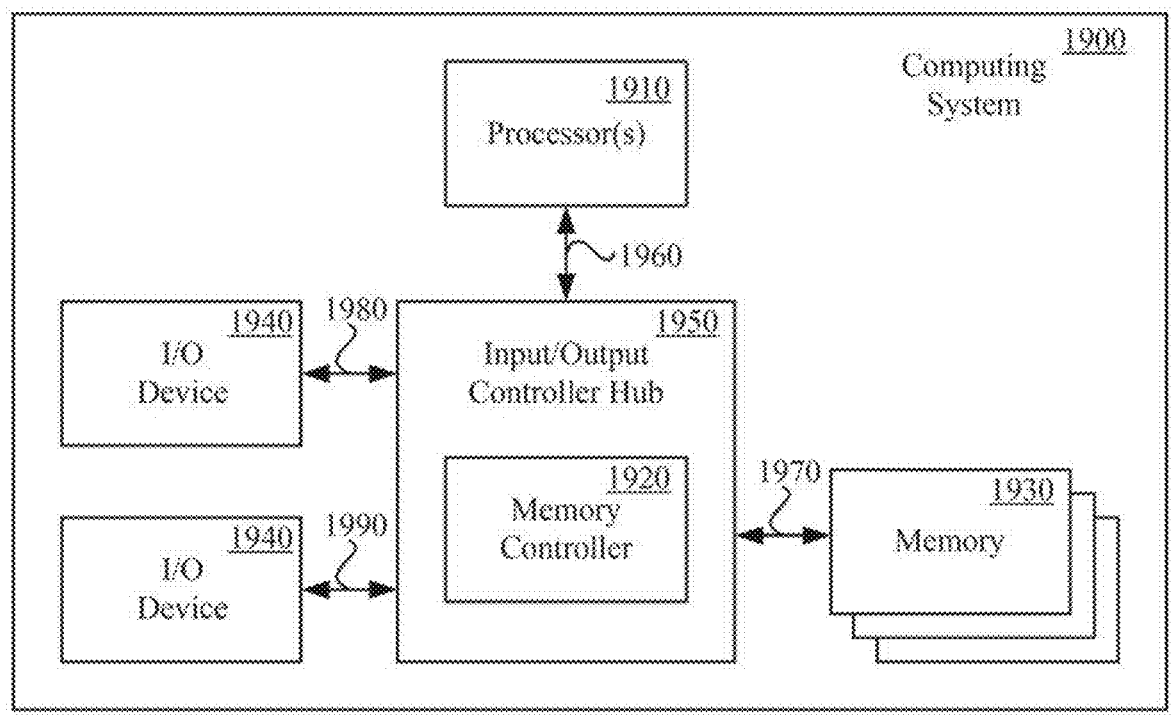
FIG. 19 shows a block diagram of a computing system including a memory device, in accordance with aspects of the present technology.

Referring now to FIG. 19, a block diagram of a computing system including a memory device, in accordance with aspects of the present technology, is shown. The computing system 1900 can, for example, be a cellular telephone, smart phone, e-reader, table personal computer (PC), laptop PC, desktop PC, gaming console, workstation, server computer, or other similar computing device. The computing system 1900 can include one or more processors 1910, one or more memory controllers 1920, one or more memory devices 1930, and one or more input/output devices 1940 that can be communicatively coupled together by one or more input/output controller hubs 1950 through one or more buses 1960-1990. The computing system 1900 can also include other sub-circuits that are not necessary for an understanding of the present technology and therefore are not discussed herein.

The one or more memory controllers 1920 can be integral to one or more other sub-circuits such as the one or more input/output controller hubs 1950 and/or memory devices 1930, or can be implemented as a separate sub-circuit. The one or more memory controllers 1920 can be operable to control access to data stored in the one or more memory devices 1930 for use by the one or more processors 1910, one or more input/output devices 1940 and/or other sub-systems of the computing system 1900. The one or more memory controllers 1920 can generate commands for reading and writing of data in the one or more memory devices 1930 in response to memory requests received from the one or more processors 1910, one or more input/output devices 1940 and/or other sub-systems. One or more of the memory devices 1930 can include the MBC array as described herein. In one implementation, the one or more memory devices 1930 can be a MBC Magnetoresistive Random Access Memory (MRAM), MBC cross-point MRAM, MBC Spin Transfer Torque Magnetoresistive Random Access Memory (STT-MRAM), MBC cross-point STT-MRAM, MBC Phase Change Memory (PCM), MBC cross-point PCM, or the like.

Figure 20:
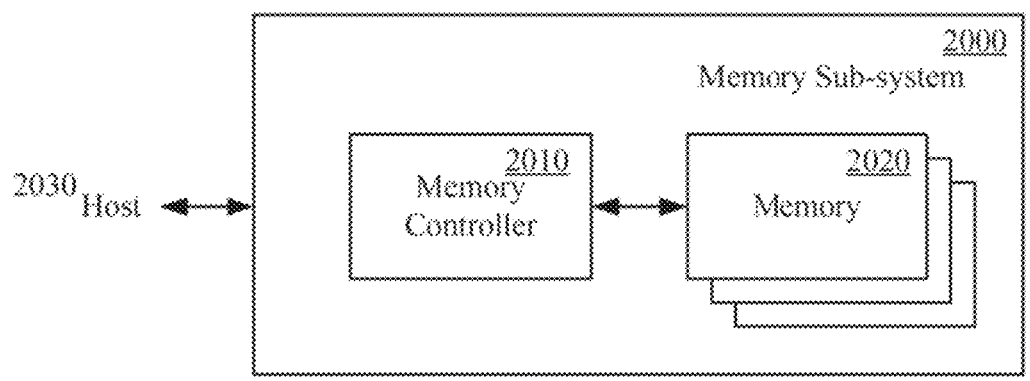
FIG. 20 shows a block diagram of a memory sub-system, in accordance with aspects of the present technology.

Referring now to FIG. 20, a block diagram of a memory sub-system, in accordance with aspects of the present technology, is shown. The memory sub-system 2000 can include one or more memory controllers 2010 and one or more memory devices 2020. The memory sub-system 2000 can be a memory expansion card, Solid State Drive (SSD), or the like that is configurable to be coupled to a host device 1330 such as a cellular telephone, smart phone, e-reader, table personal computer (PC), laptop PC, desktop PC, gaming console, workstation, server computer, or other similar computing device. The memory sub-system 2000 can be coupled to the host device 2030 as in internal or external peripheral device.

The one or more memory controllers 2010 can be operable to control access to data stored in the one or more memory devices 2020 for use by the host device 2030. The one or more memory controllers 2010 can generate commands for reading and writing of data in the one or more memory devices 2020 in response to memory requests received from the host device 2030. One or more of the memory devices 2020 can include the MBC array as described herein. In one implementation, the one or more memory devices 2020 can be a MBC Magnetoresistive Random Access Memory (MRAM), MBC cross-point MRAM, MBC Spin Transfer Torque Magnetoresistive Random Access Memory (STT-MRAM), MBC cross-point STT-MRAM, MBC Phase Change Memory (PCM), MBC cross-point PCM, or the like.

Figure 21:
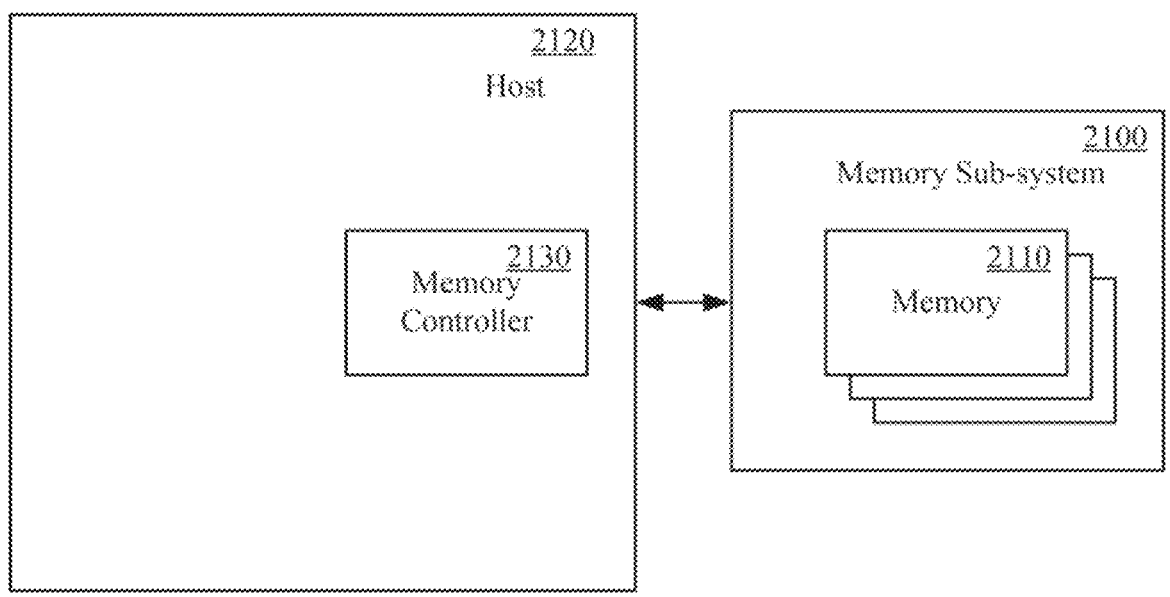
FIG. 21 shows a block diagram of a memory sub-system, in accordance with aspects of the present technology.

Referring now to FIG. 21, a block diagram of a memory sub-system, in accordance with aspects of the present technology, is shown. The memory sub-system 2100 can include one or more memory devices 2110. The memory sub-system 2100 can be a memory expansion card, Solid State Drive (SSD), or the like that is configurable to be coupled to a host device 2120 such as a cellular telephone, smart phone, e-reader, table personal computer (PC), laptop PC, desktop PC, gaming console, workstation, server computer, or other similar computing device. The host device 2120 can include one or more memory controllers 2130. The memory sub-system 2100 can be coupled to the host device 2120 as in internal or external peripheral device.

The one or more memory controllers 2130 can be operable to control access to data stored in the one or more memory devices 2110 for use by the host device 2120. The one or more memory controllers 2130 can generate commands for reading and writing of data in the one or more memory devices 2110 in response to memory requests received from the host device 2120. One or more of the memory devices 2110 can include the MBC array as described herein. In one implementation, the one or more memory devices 2110 can be a MBC Magnetoresistive Random Access Memory (MRAM), MBC cross-point MRAM, MBC Spin Transfer Torque Magnetoresistive Random Access Memory (STT-MRAM), MBC cross-point STT-MRAM, MBC Phase Change Memory (PCM), MBC cross-point PCM, or the like.

The computing systems and memory sub-systems of FIG. 17-21 are illustrative of exemplary embodiments, and are not intended to limit aspects of the present technology. The MBC devices as described herein can be readily applied to any number of conventional memory devices, memory sub-systems, and/or computing systems, along with memory devices, memory sub-systems, and/or computing systems to be developed in the future. In addition, aspects of the present technology have been described with reference to MTJ based MBCs. However, aspects of the present technology can be similarly applied to other MBC architectures, such as Phase Change Memories (PCM), as well as other similar memory architecture to be developed in the future.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A memory device comprising:
   an array of Multi-Bit Cells (MBCs), the MBCs each including a plurality of cell elements having different sets of state parameter values, wherein a pinned magnetization polarization of a first cell of the plurality of cell elements is opposite a pinned magnetization polarization of a second cell of the plurality of cell elements;
   one or more memory circuits configured to;
      sequentially apply different successive sets of state programming conditions to a selected plurality of the MBCs, wherein a respective set of state programming conditions programs a corresponding one of the plurality of cell elements to a respective state parameter value;
      determine, after applying each of the set of programming conditions, a state change result for the selected plurality of the MBCs; and
      determine a read state of the selected plurality of MBCs based on the determined state change results.

2. The memory device of claim 1, wherein the MBCs includes a first Magnetic Tunnel Junction (MTJ) element and a second MTJ element.

3. The memory device of claim 1, wherein the successive set of state programming conditions comprises:
   a first predetermined negative potential between bit lines and source lines of the selected plurality of MBCs; and
   a second predetermined negative potential between bit lines and source lines of the selected plurality of MBCs, wherein the second predetermined negative potential is more negative than the first predetermined negative potential.

4. The memory device of claim 3, wherein:
   the first predetermined negative potential is configured to program a first Magnetic Tunnel Junction (MTJ) element of the selected plurality of MBCs to a first state; and
   the second predetermined negative potential is configured to program a second MTJ element of the selected plurality of MBCs to a second state.

5. The memory device of claim 4, wherein:
   the first state comprises a parallel state; and
   the second state comprises an antiparallel state.

6. The memory device of claim 1, wherein the successive set of state programming conditions comprises:
   a first predetermined positive potential between bit lines and source lines of the selected plurality of MBCs; and
   a second predetermined positive potential between bit lines and source lines of the selected plurality of MBCs, wherein the second predetermined positive potential is more positive than the first predetermined positive potential.

7. The memory device of claim 5, wherein:
   the first predetermined positive potential is configured to program a first Magnetic Tunnel Junction (MTJ) element of the selected plurality of MBCs to a first state; and
   the second predetermined positive potential is configured to program a second MTJ element of the selected plurality of MBCs to a second state.

8. The memory device of claim 7, wherein:
   the first state comprises an antiparallel state; and
   the second state comprises a parallel state.

9. The memory device of claim 1, wherein the one or more memory circuits include:
   a word line circuit, a bit line circuit and a source line circuit configured to bias the selected plurality of MBCs with a first set of sense voltage or current levels, and a sense circuit to sense a first instance of a sense level of the selected plurality of MBCs;
   the word line circuit, the bit line circuit and the source line circuit configured to bias the selected plurality of MBCs with a first set of program voltage or current levels;
   the word line circuit, the bit line circuit and the source line circuit configured to bias the selected plurality of MBCs with the first set of sense voltage or current levels, and the sense circuit to sense a second instance of the sense level of the selected plurality of MBCs;
   the word line circuit, the bit line circuit and the source line circuit configured to bias the selected plurality of MBCs with a second set of sense voltage or current levels, and the sense circuit to sense a third instance of the sense level of the selected plurality of MBCs;

the word line circuit, the bit line circuit and the source line circuit configured to bias the selected plurality of MBCs with a second set of program voltage or current levels;

the word line circuit, the bit line circuit and the source line circuit configured to bias the selected plurality of MBCs with the second set of sense voltage or current levels, and the sense circuit to sense a fourth instance of the sense level of the selected plurality of MBCs; and a read logic circuit configured to determine the read state of the selected plurality of MBCs based on a presence or absence of a change between the first instance of the sense level and the second instance of the sense level and a presence or absence of a change between the third instance of the sense level and the fourth instance of the sense level.

10. The memory device of claim 1, wherein the sense circuit comprises:
   a plurality of current or voltage sources to apply a fixed current or fixed voltage to the selected plurality of MBCs;
   a plurality of first switches and first capacitors coupled together and configured to store the first instance of the sense level of the selected plurality of MBCs;
   a plurality of second switches and second capacitors coupled together and configured to store the second instance of the sense level and the third instance of the sense level of the selected plurality of MBCs;
   a plurality of third switches and third capacitors coupled together and configured to store the fourth instance of the sense level of the selected plurality of MBCs;
   a plurality of first comparators coupled to the plurality of first switches and first capacitors and the plurality of second switches and second capacitors and configured to compare the second instance of the sense level to the first instance of the sense level; and
   a plurality of second comparators coupled to the plurality of second switches and second capacitors and the plurality of third switches and third capacitors and configured to compare the fourth instance of the sense level to the third instance of the sense level.

11. The memory device of claim 1, wherein the one or more memory circuits are further configured to write the determined state back to the MBCs.

12. A memory device comprising:
   a Multi-Bit Cell (MBC) coupled between a bit line and a source line, wherein the multi-MBC includes a first MTJ element, a second MTJ element and a selector coupled in series, wherein the first and second MTJ elements have different low-resistance levels and different high-resistance levels, and wherein the first and second MTJ elements have opposite pinned magnetization polarization orientations;
   one or more memory circuits configured to:
      receive a read command for a selected plurality of MBCs;
      sense for each selected MBC a first sense voltage of the MBC;
      program the selected plurality of MBCs using a first program voltage after sensing the first sense voltage, wherein the first MTJ element will be in a first known state after programming;
      sense for each selected MBC a second sense voltage of the MBC after programming the MBC using the first program voltage;
      compare for each selected MBC the second sense voltage to the first sense voltage, after sensing the second sense voltage, to determine a first resistance change state;
      program the selected plurality of MBCs using a second program voltage after sensing the second sense voltage, wherein the state of the second MTJ element will be in a second known state after programming;
      sense for each selected MBC a third sense voltage of the MBC after programming the MBC using the second program voltage;
      compare for each selected MBC the third sense voltage to the second sense voltage, after sensing the third sense voltage, to determine a second resistance changed state; and
      determine a read state of the MBC based on the first resistance change state and the second resistance change state; and
      output the read state of the selected plurality of MBCs in response to the received read command.

13. The memory device of claim 10, wherein the selected plurality of MBCs includes a computing device readable media word.

14. The memory device of claim 10, wherein the selected plurality of MBCs includes a computing device readable media page.

15. The memory device of claim 10, wherein the selected plurality of MBCs includes a computing device readable media code word.

16. The memory device of claim 10, wherein the one or more circuits are further configured to:
   write the determined read state back to the selected plurality of MBCs.

17. The memory device of claim 10, wherein:
   the first programming voltage comprises a first negative potential; and
   the second programming voltage comprises a second negative potential that is more negative than the first negative potential.

18. The memory device of claim 10, wherein:
   the first programming voltage comprises a first positive potential; and
   the second programming voltage comprises a second positive potential that is more positive than the first positive potential.

19. A method of reading a Multi-Bit Cell (MBC) including a first and second MTJ coupled in series and having opposite pinned magnetization polarizations, comprising:
   sequentially applying a first and second switching condition to the selected plurality of MBCs, wherein a state of the first MTJ is in a first state after the first switching condition and a state of the second MTJ is in a second state after the second switching condition;
   determining, after applying each switching condition, whether a resistive state of the selected plurality of MBCs have changed; and
   determining a read state of the selected plurality of MBCs based on whether or not the state of the MBCs changed in response to each applied switching condition.

20. The method according to claim 19, further comprising:
   writing the determined read state back to the selected plurality of MBCs.

21. The method according to claim 19, wherein:
   the first switching condition comprises a first negative potential voltage; and the second switching condition comprises a second negative potential voltage that is more negative than the first negative potential voltage.

22. The method according to claim 21, wherein:
the first negative potential voltage is configured to program the first MTJ to a first state and not change the state of the second MTJ; and
the second negative potential voltage is configured to program the second MTJ to a second state.

23. The method according to claim 19, wherein:
the first switching condition comprises a first positive potential voltage; and
the second switching condition comprises a second positive potential voltage that is more positive than the first positive potential voltage.

24. The method according to claim 23, wherein:
the first positive potential voltage is configured to program the first MTJ to a first state and not change the state of the second MTJ; and
the second positive potential voltage is configured to program the second MTJ to a second state.

25. A method of reading from an array of Multi-Bit Cells (MBCs) comprising:
receiving a read command for a selected plurality of MBCs in the array of MBCs, wherein the MBCs each include a first and second MTJ coupled in series and having opposite pinned magnetization polarizations;
sensing for each selected MBC a first instance of a state parameter of the selected plurality of MBCs;
programming the selected plurality of MBCs using a first set of state programming conditions after sensing the first instance of the state parameter, wherein the first MTJ of the selected plurality of MBCs will be in a first state after programming;
sensing for each selected MBC a second instance of the state parameter of the selected plurality of MBCs after programming the selected plurality of MBCs using the first set of state programming conditions;
comparing for each selected MBC the second instance of the state parameter to the first instance of the state parameter, to determine a first state change result for the selected plurality of MBCs;
programming the selected plurality of MBCs using a second set of state programming conditions after sensing the second instance of the state parameter, wherein the second MTJ of the selected plurality of MBCs will be in a second state after programming;
sensing for each selected MBC a third instance of the state parameter of the selected plurality of MBCs after programming the selected plurality of MBCs using the second set of state programming conditions;
comparing for each selected MBC the third instance of the state parameter to the second instance of the state parameter, to determine a second state change result for the selected plurality of MBCs; and
outputting a read state of the selected plurality of MBCs based on the first state change result and the second state change result.

26. The method according to claim 25, wherein:
the first MTJ includes a first resistive state and a second resistive state; and
the second MTJ include a third resistive state and a fourth resistive state.

27. The method according to claim 26, wherein the first resistive state is greater than the third resistive state and the second resistive state is greater than the fourth resistive state.

28. The method according to claim 25, wherein:
the first set of state programming conditions comprise a first negative potential voltage; and
the second set of state programming conditions comprise a second negative potential voltage that is more negative than the first negative potential voltage.

29. The method according to claim 25, wherein:
the first set of state programming conditions comprise a first positive potential voltage; and
the second set of state programming conditions comprise a second positive potential voltage that is more positive than the first positive potential voltage.

30. The method according to claim 25, further comprising:
writing back the read state to the selected plurality of MBCs.

* * * * *